United States Patent
Kobayashi et al.

(10) Patent No.: US 7,388,649 B2
(45) Date of Patent: Jun. 17, 2008

(54) EXPOSURE APPARATUS AND METHOD FOR PRODUCING DEVICE

(75) Inventors: Naoyuki Kobayashi, Fukaya (JP); Akikazu Tanimoto, Yokohama (JP); Yasushi Mizuno, Saitama (JP); Kenichi Shiraishi, Saitama (JP); Katsushi Nakano, Kumagaya (JP); Soichi Owa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/284,187

(22) Filed: Nov. 22, 2005

(65) Prior Publication Data

US 2006/0077367 A1   Apr. 13, 2006

Related U.S. Application Data

(63) Continuation of application No. PCT/JP2004/007417, filed on May 24, 2004.

(30) Foreign Application Priority Data

| May 23, 2003 | (JP) | ............ 2003-146423 |
| Aug. 28, 2003 | (JP) | ............ 2003-305280 |
| Feb. 25, 2004 | (JP) | ............ 2004-049231 |

(51) Int. Cl.
G03B 27/42 (2006.01)
G03B 27/52 (2006.01)

(52) U.S. Cl. .......................... 355/53; 355/30
(58) Field of Classification Search ............ 355/30, 355/53, 71, 75
See application file for complete search history.

(56) References Cited

U.S. PATENT DOCUMENTS

| 3,648,587 | A | * | 3/1972 | Stevens .................. 355/44 |
| 4,346,164 | A | | 8/1982 | Tabarelli et al. |
| 4,465,368 | A | | 8/1984 | Matsuura et al. |
| 4,480,910 | A | | 11/1984 | Takanashi et al. |
| 4,780,747 | A | | 10/1988 | Suzuki et al. |
| 5,610,683 | A | | 3/1997 | Takahashi |
| 5,715,039 | A | | 2/1998 | Fukuda et al. |
| 5,825,043 | A | * | 10/1998 | Suwa .................... 250/548 |

(Continued)

FOREIGN PATENT DOCUMENTS

DE   DD 221 563 A1   4/1985

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner*—Hung Henry V Nguyen
(74) *Attorney, Agent, or Firm*—Oliff & Berridge, PLC

(57) ABSTRACT

There is provided an exposure apparatus capable of forming a desirable device pattern by removing unnecessary liquid when performing exposure by projecting a pattern onto the substrate via a projection optical system and the liquid. The exposure device projects an image of the pattern onto the substrate P via the projection optical system and the liquid so as to expose the substrate P. The exposure device includes a liquid removing mechanism 40 which removes the liquid remaining on a part 7 arranged in the vicinity of the image plane of the projection optical system.

50 Claims, 26 Drawing Sheets

U.S. PATENT DOCUMENTS

| | | |
|---|---|---|
| 6,208,407 B1 | 3/2001 | Loopstra |
| 6,341,007 B1 | 1/2002 | Nishi et al. |
| 2002/0041377 A1 | 4/2002 | Hagiwara et al. |
| 2002/0061469 A1 | 5/2002 | Tanaka |
| 2002/0163629 A1 | 11/2002 | Switkes et al. |
| 2003/0011763 A1 | 1/2003 | Taniguchi et al. |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0075895 A1 | 4/2004 | Lin |
| 2004/0090606 A1 | 5/2004 | Ishikawa |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0007569 A1 | 1/2005 | Streefkerk et al. |
| 2005/0024609 A1 | 2/2005 | De Smit et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259233 A1 | 11/2005 | Streefkerk et al. |
| 2005/0259262 A1 | 11/2005 | Streefkerk et al. |
| 2005/0270505 A1 | 12/2005 | Smith |
| 2006/0119813 A1* | 6/2006 | Hultermans et al. ........... 355/53 |

FOREIGN PATENT DOCUMENTS

| | | |
|---|---|---|
| DE | DD 224 448 A1 | 7/1985 |
| EP | 1 420 299 A2 | 5/2004 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-04-305915 | 10/1992 |
| JP | A-4-305915 | 10/1992 |
| JP | A-04-305917 | 10/1992 |
| JP | A-4-305917 | 10/1992 |
| JP | A-5-62877 | 3/1993 |
| JP | A-05-62877 | 3/1993 |
| JP | A-11-283903 | 10/1993 |
| JP | A-6-124873 | 5/1994 |
| JP | A-7-220990 | 8/1995 |
| JP | A-07-220990 | 8/1995 |
| JP | A-8-316125 | 11/1996 |
| JP | A-10-303114 | 11/1998 |
| JP | A-10-340846 | 12/1998 |
| JP | A-11-135400 | 5/1999 |
| JP | A-11-176727 | 7/1999 |
| JP | A-2000-58436 | 2/2000 |
| WO | WO99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |

| | | |
|---|---|---|
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, Litho Forum, Jan. 28, 2004, "Update on 193 nm immersion exposure tool", S. Owa et al., 51 pages (slides 1-51).

Nikon Corporation, Immersion Lithography Workshop, Dec. 11, 2002, 24 pages (slides 1-24).

Nikon Corporation, Immersion Workshop, Jan. 27, 2004, "Update on 193 nm immersion exposure tool", S. Owa et al., 38 pages (slides 1-38).

Nikon Corporation, 3rd 157 nm symposium, Sep. 4, 2002, "Nikon F2 Exposure Tool", Soichi Owa et al., 25 pages (slides 1-25).

Optical Microlithography XVI, Proceedings of SPIE vol. 5040 (2003), "Immersion lithogrpahy; its potential performance and issues", Soichi Owa et al., pp. 724-733.

Nikon Corporation, NGL Workshop, Jul. 10, 2003, "Potential performance and feasibility of immersion lithography", Soichi Owa et al., 33 pages, slides 1-33.

* cited by examiner

EXPOSURE APPARATUS AND METHOD FOR PRODUCING DEVICE

CROSS-REFERENCE

This application is a Continuation Application of International Application No. PCT/JP2004/007417 which was filed on May 24, 2004 claiming the conventional priority of Japanese patent Application Nos. 2003-146423 filed on May 23, 2003; 2003-305280 filed on Aug. 28, 2003; and 2004-049231 filed on Feb. 25, 2004.

BACKGROUND OF THE INVENTION

1. Field of the Invention

The present invention relates to an exposure apparatus and a method for producing a device in which a substrate is exposed with a pattern via a projection optical system and a liquid.

2. Description of the Related Art

Semiconductor devices and liquid crystal display devices are produced by the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus $\delta$ are represented by the following expressions respectively.

$$R = k_1 \cdot \lambda / NA \quad (1)$$

$$\delta = \pm k_2 \cdot \lambda / NA^2 \quad (2)$$

In the expressions, $\lambda$ represents the exposure wavelength, NA represents the numerical aperture of the projection optical system, and $k_1$ and $k_2$ represent the process coefficients. According to the expressions (1) and (2), the following fact is appreciated. That is, when the exposure wavelength $\lambda$ is shortened and the numerical aperture NA is increased in order to enhance the resolution R, then the depth of focus $\delta$ is narrowed.

If the depth of focus $\delta$ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

However, the conventional technique as described above involves the following problem. The exposure apparatus, which is disclosed in International Publication No. 99/49504, is constructed such that the liquid is supplied and recovered to form the liquid immersion area on a part of the substrate. In the case of this exposure apparatus, for example, when the substrate stage is moved to the load/unload position in order to unload the substrate having been placed on the substrate stage and load a new substrate in a state in which the liquid in the liquid immersion area is not recovered sufficiently after the completion of the liquid immersion exposure, there is such a possibility that the liquid, which remains on (adheres to) the end portion of the projection optical system, the liquid supply nozzle, and/or the liquid recovery nozzle, may fall onto surrounding units and members including, for example, the guide surface of the stage and the reflecting surface for the interferometer for the stage.

Further, when the liquid remains on the optical element disposed at the end portion of the projection optical system, the remaining liquid leaves any adhesion trace (so-called water mark) on the optical element disposed at the end portion of the projection optical system after the evaporation of the remaining liquid. There is such a possibility that any harmful influence may be exerted on the pattern to be formed on the substrate during the exposure process to be subsequently performed. It is also assumed that the liquid immersion area is formed during any process other than the exposure process, i.e., when the reference mark member and/or the reference plane member arranged around the substrate on the substrate stage is used. In such a situation, there is such a possibility that the liquid in the liquid immersion area cannot be recovered sufficiently, the adhesion trace may remain on the member as described above, and the liquid remaining on the member as described above may be scattered.

SUMMARY OF THE INVENTION

The present invention has been made taking the foregoing circumstances into consideration, an object of which is to provide an exposure apparatus capable of forming a desired device pattern on a substrate by sufficiently removing any unnecessary liquid when the pattern is projected onto the substrate to perform the exposure via a projection optical system and the liquid, and a method for producing a device based on the use of the exposure apparatus.

In order to achieve the object as described above, the present invention adopts the following constructions.

According to a first aspect of the present invention, there is provided an exposure apparatus which projects an image of a pattern onto a substrate through a liquid to expose the substrate therewith; the exposure apparatus comprising a projection optical system which projects the image of the pattern onto the substrate; and a liquid-removing mechanism which removes the liquid remaining on a part arranged in the vicinity of an image plane of the projection optical system.

According to the present invention, any unnecessary liquid, which remains on the part arranged in the vicinity of the image plane of the projection optical system, including, for example, an optical element disposed at the end portion of the projection optical system, a reference member for positioning the shot area, various sensors, a light-transmitting optical member, and a nozzle of the liquid supply and/or the liquid recovery mechanism, is removed by the liquid-removing mechanism. Accordingly, it is possible to avoid the scattering and the falling of the remaining liquid and the occurrence of the adhesion trace (water mark) on the part as described above. Therefore, it is possible to form the desired pattern accurately on the substrate.

According to a second aspect of the present invention, there is provided an exposure apparatus which exposes a substrate by forming a liquid immersion area on a part of the substrate and projecting an image of a pattern onto the substrate through a liquid in the liquid immersion area, the exposure apparatus comprising:

a projection optical system which projects the image of the pattern onto the substrate;

a substrate stage which is movable while holding the substrate;

a liquid supply mechanism which supplies the liquid onto the substrate to form the liquid immersion area;

a first liquid recovery mechanism which recovers the liquid from a surface of the substrate; and a second liquid recovery mechanism which has a recovery port provided on the substrate stage and which recovers the liquid after completion of the exposure for the substrate.

According to the present invention, the liquid in the liquid immersion area on the substrate is recovered by not only the first liquid recovery mechanism but also the second liquid recovery mechanism having the recovery port on the stage after the completion of the liquid immersion exposure. Accordingly, it is possible to avoid the scattering and the falling of the remaining liquid and the occurrence of the adhesion trace of the remaining liquid. Therefore, it is possible to form the desired pattern accurately on the substrate.

According to a third aspect of the present invention, there is provided an exposure apparatus which exposes a substrate by projecting an image of a pattern onto the substrate through a liquid; the exposure apparatus comprising a projection optical system which projects the image of the pattern onto the substrate; and a detection unit which detects a state of a surface of a part arranged in the vicinity of an image plane side of the projection optical system.

According to the present invention, the detection unit can be used to detect the surface state of the part arranged in the vicinity of the image plane of the projection optical system (whether or not any foreign matter such as the liquid is adhered). Therefore, it is possible to perform an appropriate treatment including, for example, the removal of the foreign matter from the surface of the part by the washing, depending on an obtained result.

According to a fourth aspect of the present invention, there is provided a method for producing a device, wherein the exposure apparatus as defined in any one of the aspects described above is used. According to the present invention, it is possible to produce the device having desired performance in a state in which the environmental change and the occurrence of the adhesion trace on the optical element disposed in the vicinity of the image plane of the projection optical system are suppressed.

DESCRIPTION OF THE PREFERRED EMBODIMENTS OF THE INVENTION

An explanation will be made below about embodiments of the exposure apparatus according to the present invention with reference to the drawings. However, the present invention is not limited thereto.

Figure 1:
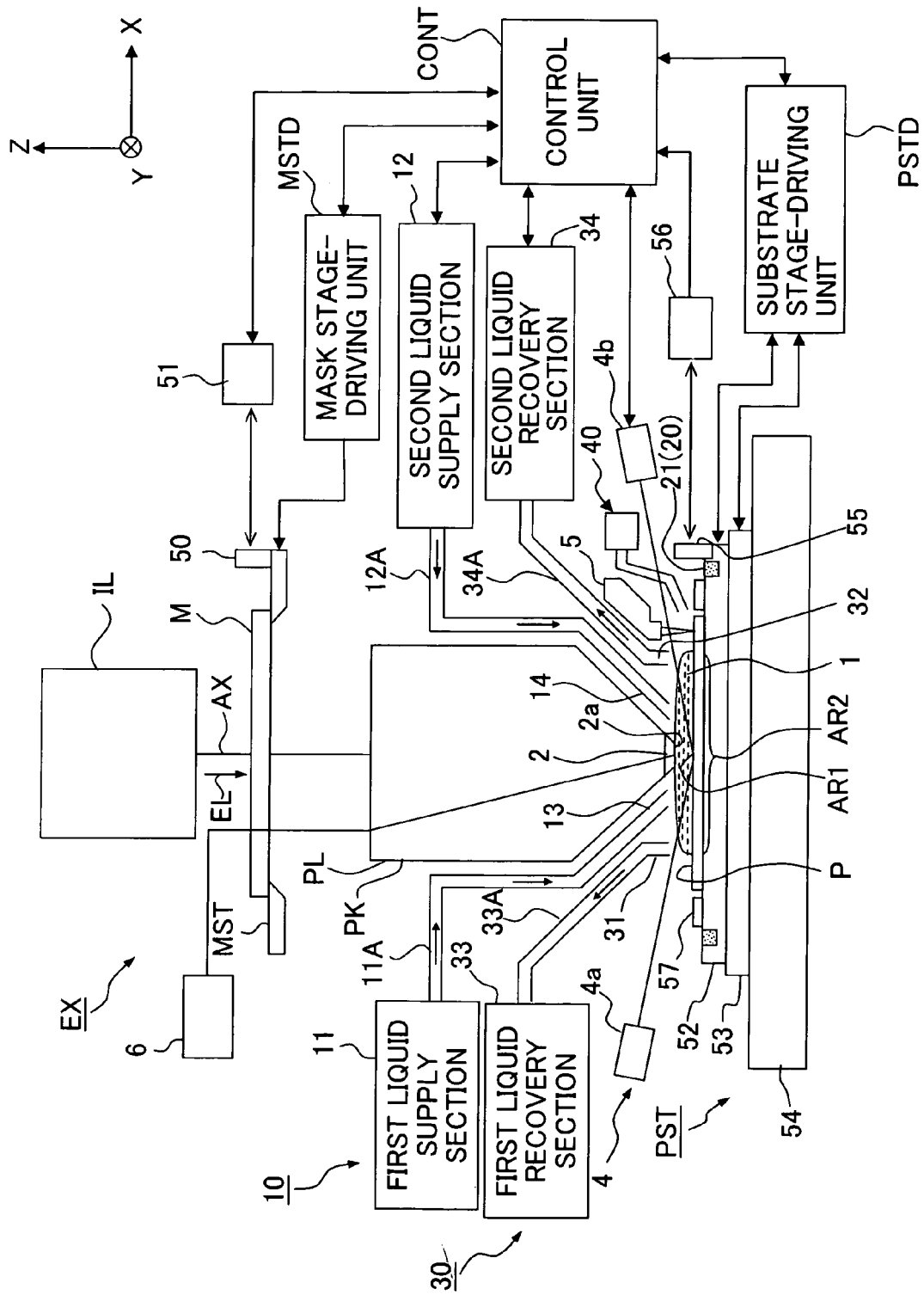
FIG. 1 shows a schematic arrangement illustrating an embodiment of an exposure apparatus of the present invention.

Embodiment of Exposure Apparatus Based on Use of First and Second Liquid-Removing Units FIG. 1 shows a schematic arrangement illustrating an embodiment of the exposure apparatus of the present invention. With reference to FIG. 1, an exposure apparatus EX includes a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, and a control unit CONT which collectively controls the overall operation of the exposure apparatus EX.

The exposure apparatus EX of this embodiment is a liquid immersion exposure apparatus to which the liquid immersion method is applied in order that the exposure wavelength is substantially shortened to improve the resolution and the depth of focus is substantially widened. The exposure apparatus EX includes a liquid supply mechanism 10 which supplies the liquid 1 onto the substrate P, and a liquid recovery mechanism (first liquid recovery mechanism) 30 which recovers the liquid 1 from the surface of the substrate P. In this embodiment, pure water is used as the liquid 1. The exposure apparatus EX forms a liquid immersion area AR2 on at least a part of the substrate P including a projection area AR1 of the projection optical system PL by the liquid 1 supplied from the liquid supply mechanism 10 at least during the period in which the pattern image of the mask M is transferred onto the substrate P. Specifically, the exposure apparatus EX is operated as follows. That is, the space between the surface (exposure surface) of the substrate P and the optical element 2 disposed at the end portion of the projection optical system PL is filled with the liquid 1. The pattern image of the mask M is projected onto the substrate P to expose the substrate P therewith via the projection optical system PL and the liquid 1 disposed between the projection optical system PL and the substrate P.

The embodiment of the present invention will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the X axis direction is the synchronous movement direction (scanning direction) for the mask M and the substrate P in the horizontal plane, the Y axis direction (non-scanning direction) is the direction which is perpendicular to the X axis direction in the horizontal plane, and the Z axis direction is the direction which is perpendicular to the X axis direction and the Y axis direction and which is coincident with the optical axis AX of the projection optical system PL. The directions about the X axis, the Y axis, and the Z axis are designated as θX, θY, and θZ directions respectively. The term "substrate" referred to herein includes substrates obtained by coating a semiconductor wafer surface with a resist, and the term "mask" includes a reticle formed with a device pattern to be subjected to the reduction projection onto the substrate.

The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used. As described above, the liquid 1 is pure water in this embodiment, through which the exposure light beam EL is transmissive even when the exposure light beam EL is the ArF excimer laser beam. The emission line (g-ray, h-ray, i-ray) in the ultraviolet region and the far ultraviolet light beam (DUV light beam) such as the KrF excimer laser beam (wavelength: 248 nm) are also transmissive through pure water.

The mask stage MST supports the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. A movement mirror 50 is provided on the mask stage MST. A laser interferometer 51 is provided at a position opposed to the movement mirror 50. The position in the two-dimensional direction and the angle of rotation of the mask M on the mask stage MST are measured in real-time by the laser interferometer 51. The result of the measurement is outputted to the control unit CONT. The control unit CONT drives the mask stage-driving unit MSTD on the basis of the result of the measurement obtained by the laser interferometer 51 to thereby position the mask M supported on the mask stage MST.

The projection optical system PL projects the pattern on the mask M onto the substrate P at a predetermined projection magnification β to perform the exposure. The projection optical system PL includes a plurality of optical elements including the optical element (lens) 2 provided at the end portion on the side of the substrate P. The optical elements are supported by a barrel PK. In this embodiment, the projection optical system PL is the reduction system having the projection magnification β which is, for example, ¼ or ⅕. The projection optical system PL may be any one of the 1× magnification system and the magnifying system. The optical element 2, which is disposed at the end portion of the projection optical system PL of this embodiment, is provided detachably (exchangeably) with respect to the barrel PK. The optical element 2, which is disposed at the end portion, is exposed (protrudes) from the barrel PK. The liquid 1 in the liquid immersion area AR2 makes contact with only the optical element 2. Accordingly, the barrel PK formed of metal can be prevented from any corrosion or the like.

The optical element 2 is formed of fluorite. Fluorite has a high affinity for water. Therefore, the liquid 1 is successfully allowed to make tight contact with the substantially entire surface of the liquid contact surface 2a of the optical element 2. That is, in this embodiment, the liquid (pure water) 1, which has the high affinity for the liquid contact surface 2a of the optical element 2, is supplied. Therefore, the highly tight contact is effected between the liquid 1 and the optical element 2. Quartz having a high affinity for water may be used as the optical element 2 as well. A water-attracting (lyophilic or liquid-attracting) treatment may be applied to the liquid contact surface 2a of the optical element 2 to further enhance the affinity for the liquid 1.

The exposure apparatus EX further includes a focus-detecting system 4. The focus-detecting system 4 has a light-emitting section 4a and a light-receiving section 4b. The detecting light beam is projected obliquely from an upper position onto the surface (exposure surface) of the substrate P via the liquid 1 from the light-emitting section 4a. The reflected light beam from the surface of the substrate P is received by the light-receiving section 4b. The control unit CONT controls the operation of the focus-detecting system 4. Further, the position (focus position) in the Z axis direction of the surface of the substrate P with respect to a predetermined reference surface is detected on the basis of a light-receiving result obtained by the light-receiving section 4b. Respective focus positions at a plurality of respective points on the surface of the substrate P are determined by using the focus-detecting system 4. Accordingly, it is also possible to detect the posture of the substrate P in an inclined direction. Those usable for the arrangement or the structure of the focus-detecting system 4 may include, for example, one disclosed in Japanese Patent Application Laid-open No. 8-37149.

The substrate stage PST supports the substrate P. The substrate stage PST includes a Z stage 52 which holds the substrate P by the aid of a substrate holder, an XY stage 53 which supports the Z stage 52, and a base 54 which supports the XY stage 53. The substrate stage PST is driven by a substrate stage-driving unit PSTD such as a linear motor. The substrate stage-driving unit PSTD is controlled by the control unit CONT. It goes without saying that the Z stage and the XY stage may be provided as an integrated body. When the XY stage 53 of the substrate stage PST is driven, the substrate P is subjected to the control of the position in the XY directions (position in the direction substantially parallel to the image plane of the projection optical system PL).

A movement mirror 55, which is movable together with the substrate stage PST with respect to the projection optical system PL, is provided on the substrate stage PST (Z stage 52). A laser interferometer 56 is provided at a position opposed to the movement mirror 55. The angle of rotation and the position in the two-dimensional direction of the substrate P on the substrate stage PST are measured in real-time by the laser interferometer 56. The result of the measurement is outputted to the control unit CONT. The control unit CONT drives the XY stage 53 by the aid of the substrate stage-driving unit PSTD on the basis of the result of the measurement of the laser interferometer 56 to thereby position the substrate P supported on the substrate stage PST in the X axis direction and the Y axis direction.

The control unit CONT drives the Z stage 52 of the substrate stage PST by the aid of the substrate stage-driving unit PSTD. Accordingly, the control unit CONT controls the position (focus position) in the Z axis direction of the substrate P held by the Z stage 52 and the position in the θX direction and the θY direction. That is, the Z stage 52 is operated on the basis of the instruction from the control unit CONT based on the result of the detection performed by the focus-detecting system 4. The focus position (Z position) and the angle of inclination of the substrate P are controlled so that the surface (exposure surface) of the substrate P is adjusted to the image plane formed via the projection optical system PL and the liquid 1.

An auxiliary plate 57 having a flat surface is provided on the substrate stage PST (Z stage 52) so that the substrate P is surrounded thereby. The auxiliary plate 57 is installed so that the surface has approximately the same height as that of the surface of the substrate P held by the substrate holder. In this arrangement, a gap of about 0.1 to 2 mm is formed between the auxiliary plate 57 and the edge of the substrate P. However, the liquid 1 scarcely flows into the gap owing to the surface tension of the liquid 1. Even when the vicinity of the circumferential edge of the substrate P is subjected to the exposure, the liquid 1 can be retained under the projection optical system PL by the aid of the auxiliary plate 57.

A substrate alignment system 5, which detects the alignment mark on the substrate P or the reference mark provided on the Z stage 52, is provided in the vicinity of the end portion of the projection optical system PL. A mask alignment system 6, which detects the reference mark provided on the Z stage 52 via the mask M and the projection optical system PL, is provided in the vicinity of the mask stage MST. Those usable for the arrangement of the substrate alignment system 5 include, for example, one disclosed in Japanese Patent Application Laid-open No. 4-65603. Those usable for the arrangement of the mask alignment system 6 include, for example, one disclosed in Japanese Patent Application Laid-open No. 7-176468.

A first liquid-removing unit 40, which removes the liquid 1 remaining on the reference member having the reference mark provided on the Z stage 52, is provided in the vicinity of the substrate alignment system 5. The substrate stage PST is provided with a second liquid recovery unit 20 which recovers the liquid 1.

The liquid supply mechanism 10 supplies the predetermined liquid 1 onto the substrate P in order to form the liquid immersion area AR2. The liquid supply mechanism 10 includes a first liquid supply section 11 and a second liquid supply section 12 which are capable of feeding the liquid 1, a first supply nozzle 13 which is connected to the first liquid supply section 11 through a supply tube 11A having a flow passage and which has a supply port for supplying the liquid 1 fed from the first liquid supply section 11 onto the substrate P, and a second supply nozzle 14 which is connected to the second liquid supply section 12 through a supply tube 12A having a flow passage and which has a supply port for supplying the liquid 1 fed from the second liquid supply section 12 onto the substrate P. The first and second supply nozzles 13, 14 make contact with the liquid 1 in the liquid immersion area AR2 during the liquid immersion exposure. The first and second supply nozzles 13, 14 are arranged closely to the surface of the substrate P, and they are provided at mutually different positions in the surface direction of the substrate P. Specifically, the first supply nozzle 13 of the liquid supply mechanism 10 is provided on one side (−X side) in the scanning direction with respect to the projection area AR1. The second supply nozzle 14 is provided on the other side (+X side) in the scanning direction so that the second supply nozzle 14 is opposed to the first supply nozzle 13.

Each of the first and second liquid supply sections 11, 12 includes, for example, a tank for accommodating the liquid 1, and a pressurizing pump. The first and second liquid supply sections 11, 12 supply the liquid 1 onto the substrate P through the supply tubes 11A, 12A and the supply nozzles 13, 14 respectively. The operation of the first and second liquid supply sections 11, 12 for supplying the liquid is controlled by the control unit CONT. The control unit CONT is capable of controlling the liquid supply amounts per unit time onto the substrate P by the first and second liquid supply sections 11, 12 independently respectively. Each of the first and second liquid supply sections 11, 12 includes a temperature-adjusting mechanism for the liquid 1. The liquid 1, which has approximately the same temperature of 23° C. as the temperature in the chamber for accommodating the apparatus therein, is supplied onto the substrate P.

It is preferable that the pure water (liquid), which is supplied from the liquid supply sections 11, 12, has a transmittance of not less than 99%/mm. In this case, it is desirable that the value of TOC (total organic carbon), which indicates the total amount of carbon contained in organic compounds, is less than 3 ppb in relation to carbon compounds dissolved in the pure water.

The liquid recovery mechanism (first liquid recovery unit) 30 recovers the liquid 1 from the surface of the substrate P. The liquid recovery mechanism 30 includes first and second recovery nozzles 31, 32 each of which has a recovery port arranged closely to the surface of the substrate P, and first and second liquid recovery sections 33, 34 which are connected to the first and second recovery nozzles 31, 32 through recovery tubes 33A, 34A having flow passages respectively. The first and second recovery nozzles 31, 32 make contact with the liquid 1 in the liquid immersion area AR2 during the liquid immersion exposure. Each of the first and second liquid recovery sections 33, 34 includes, for example, a sucking unit such as a vacuum pump, and a tank for accommodating the recovered liquid 1. The first and second liquid recovery sections 33, 34 recover the liquid 1 from the surface of the substrate P through the first and second recovery nozzles 31, 32 and the recovery tubes 33A, 34A. The operation of each of the first and second liquid recovery sections 33, 34 for recovering the liquid is controlled by the control unit CONT. The control unit CONT is capable of controlling the liquid recovery amounts per unit time by the first and second liquid recovery sections 33, 34 independently respectively.

Figure 2:
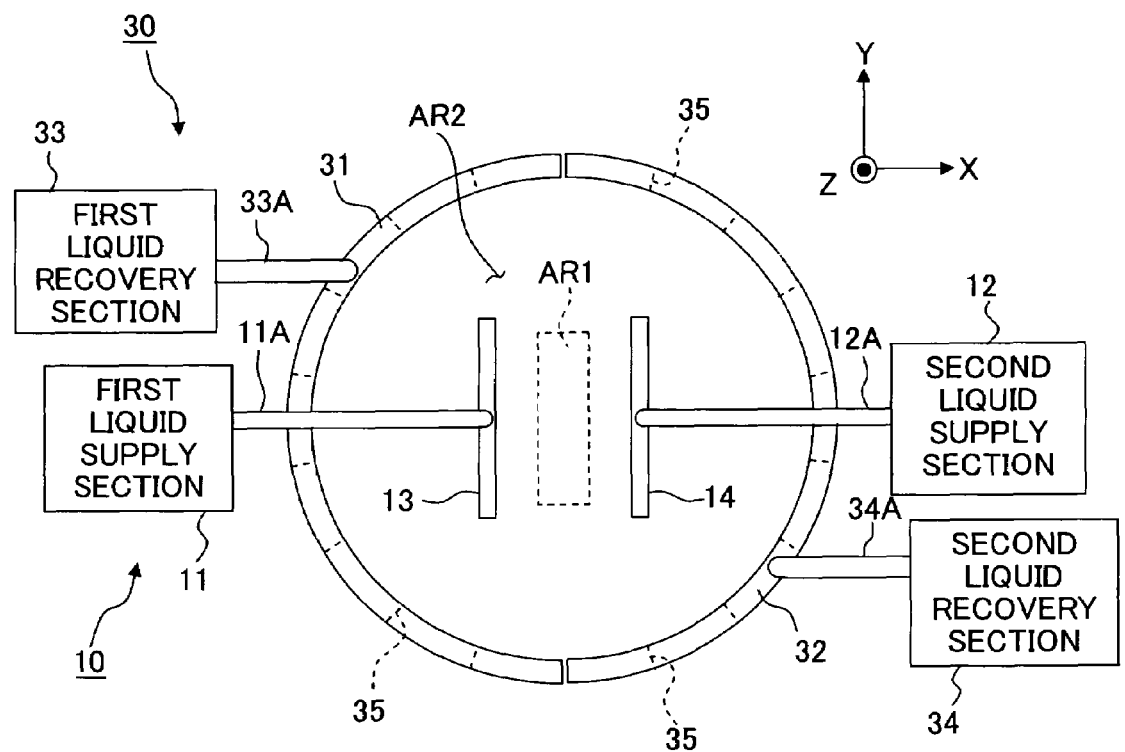
FIG. 2 shows a schematic arrangement illustrating a liquid recovery mechanism and a liquid supply mechanism for forming a liquid immersion area.

FIG. 2 shows a plan view illustrating a schematic arrangement of the liquid supply mechanism 10 and the liquid recovery mechanism 30. As shown in FIG. 2, the projection area AR1 of the projection optical system PL is designed to have a slit shape (rectangular shape) in which the Y axis direction (non-scanning direction) is the longitudinal direction. The liquid immersion area AR2, which is filled with the liquid 1, is formed on a part of the substrate P so that the projection area AR1 is included therein. As described above, the first supply nozzle 13 of the liquid supply mechanism 10, which is used to form the liquid immersion area AR2 for the projection area AR1, is provided on one side (−X side) in the scanning direction with respect to the projection area AR1, and the second supply nozzle 14 is provided on the other side (+X side) in the scanning direction on the opposite side. The first and second supply nozzles 13, 14 are formed to be linear as viewed in a plan view in which the Y axis direction is the longitudinal direction respectively. The supply ports of the first and second supply nozzles 13, 14 are formed to be slit-shaped while the Y axis direction is the longitudinal direction respectively, and they are directed to the surface of the substrate P. The liquid supply mechanism 10 simultaneously supplies the liquid 1 from the ± sides in the X direction of the projection area AR1 from the supply ports of the first and second supply nozzles 13, 14.

As appreciated from FIG. 2, each of the first and second recovery nozzles 31, 32 of the liquid recovery mechanism 30 has a recovery port which is formed continuously to be circular arc-shaped so that the recovery port is directed to the surface of the substrate P. A substantially annular recovery port is formed by the first and second recovery nozzles 31, 32 which are arranged so that they are opposed to one another. The respective recovery ports of the first and second recovery nozzles 31, 32 are arranged to surround the projection area AR1 and the first and second supply nozzles 13, 14 of the liquid supply mechanism 10. A plurality of partition members 35 are provided in the recovery port formed continuously to surround the projection area AR1.

The liquid 1, which is supplied onto the substrate P from the supply ports of the first and second supply nozzles 13, 14, is supplied so that the liquid 1 is spread while causing the wetting between the substrate P and the lower end surface of the end portion (optical element 2) of the projection optical system PL. The liquid 1, which is supplied from the first and second supply nozzles 13, 14, is recovered from the recovery ports of the first and second recovery nozzles 31, 32.

Figure 3:
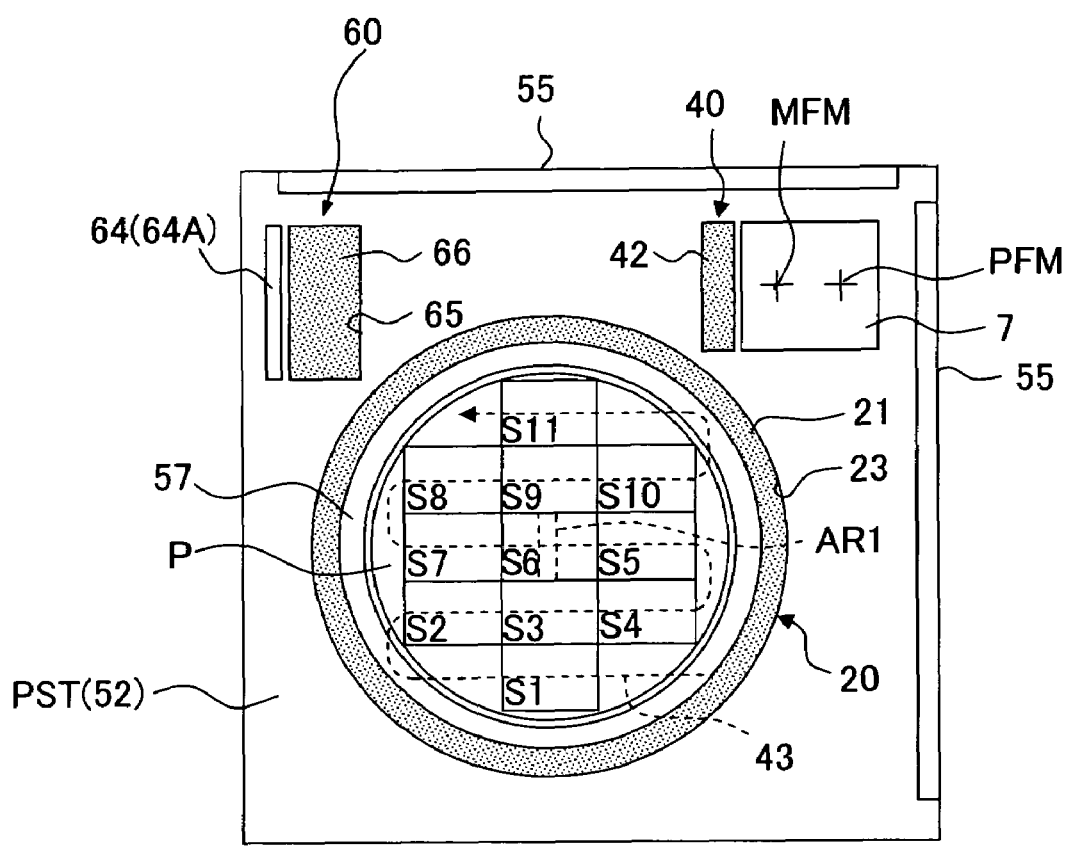
FIG. 3 shows a plan view illustrating a substrate stage.

FIG. 3 shows a schematic plan view illustrating the Z stage 52 of the substrate stage PST as viewed from an upper position. The movement mirrors 55 are arranged on the mutually perpendicular two side surfaces of the rectangular Z stage 52. The substrate P is held at a substantially central portion of the Z stage 52 by the aid of an unillustrated holder. As described above, the auxiliary plate 57, which has the flat surface of substantially the same height as that of the surface of the substrate P, is provided around the substrate P. A liquid-absorbing member 21, which constitutes a part of the second liquid recovery unit 20 for recovering the liquid 1, is provided around the auxiliary plate 57. The liquid-absorbing member 21 is an annular member having a predetermined width, which is arranged in a groove (recovery port) 23 formed annularly on the Z stage 52. The liquid-absorbing member 21 is formed of a porous material including, for example, a porous ceramics. Alternatively, a sponge as a porous material may be used as the material for forming the liquid-absorbing member 21. When the liquid-absorbing member 21 formed of the porous material is used as described above, a predetermined amount of the liquid 1 can be retained by the liquid-absorbing member 21.

Figure 4:
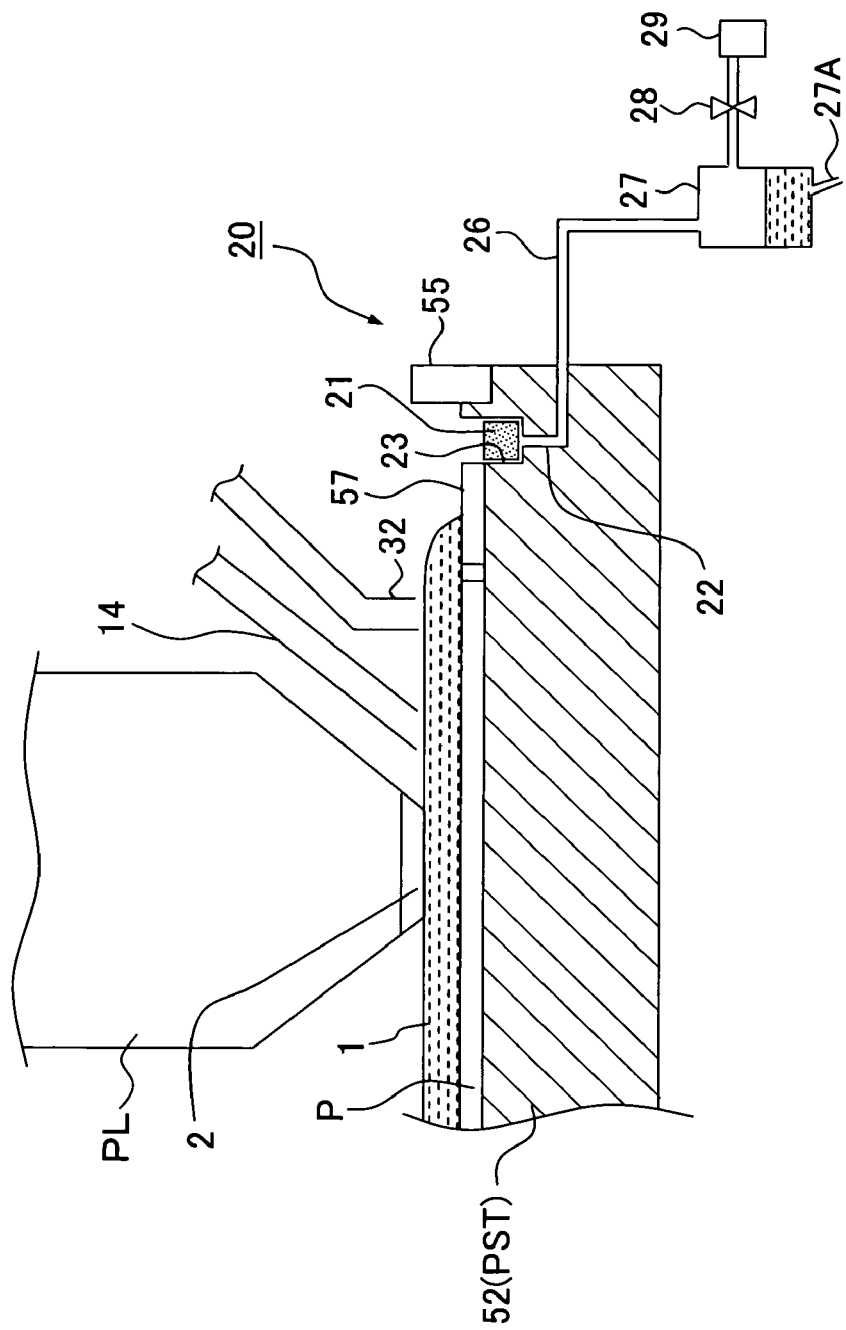
FIG. 4 shows an example of a second liquid recovery unit.

FIG. 4 shows a sectional view illustrating the second liquid recovery unit 20. The second liquid recovery unit 20 includes the liquid-absorbing member 21 which is arranged in the groove (recovery port) 23 formed annularly on the Z stage 52 as described above, a flow passage 22 which is formed in the Z stage 52 and which is communicated with the groove 23, a tube passage 26 which is provided outside the Z stage 52 and which has one end connected to the flow passage 22, a tank 27 which is connected to the other end of the tube passage 26 and which is provided outside the Z stage 52, and a pump 29 as a sucking unit which is connected to the tank 27 via a valve 28. The liquid recovery unit 20 drives the pump 29 to suck the liquid 1 recovered by the liquid-absorbing member 21 so that the liquid 1 is collected in the tank 27. The tank 27 is provided with a discharge flow passage 27A. When a predetermined amount of the liquid 1 is pooled in the tank 27, the liquid 1 contained in the tank 27 is discharged to the outside via the discharge flow passage 27A.

With reference to FIG. 3 again, a reference member 7 is provided in the vicinity of one corner of the Z stage 52. A reference mark PFM which is to be detected by the substrate alignment system 5 and a reference mark MFM which is to be detected by the mask alignment system 6 are provided on the reference member 7 in a predetermined positional relationship. The surface of the reference member 7 is substantially flat, which also functions as a reference surface for the focus-detecting system 4. The reference surface for the focus-detecting system 4 may be provided on the Z stage 52 separately from the reference member 7. The reference member 7 and the auxiliary plate 57 may be provided as an integrated body.

A liquid-absorbing member 42, which constitutes a part of the first liquid-removing unit 40 for removing the liquid 1 remaining on the reference member 7, is provided in the vicinity of the reference member 7 on the Z stage 52. Further, a second liquid-removing unit 60, which removes the liquid 1 remaining on the optical element 2 disposed at the end portion of the projection optical system PL and/or the barrel PK disposed in the vicinity of the end portion, is provided in the vicinity of another corner of the Z stage 52.

Next, an explanation will be made with reference to a flow chart shown in FIG. 27 about a procedure for exposing the substrate P with the pattern on the mask M by using the exposure apparatus EX described above. The position information about the alignment mark is determined in a state in which the liquid 1 is absent on the substrate P before supplying the liquid 1 from the liquid supply mechanism 10. The control unit CONT moves the XY stage 53 while monitoring the output of the laser interferometer 56 so that the portion corresponding to the optical axis AX of the projection optical system PL is advanced along a broken line arrow 43 shown in FIG. 3. During the movement, the substrate alignment system 5 detects a plurality of alignment marks (not shown) formed on the substrate P corresponding to the shot areas S1 to S11 without passing through the liquid 1 (Step SA1, FIG. 27). The alignment marks are detected by the substrate alignment system 5 in a state in which the XY stage 53 is stopped. As a result, the position information about the respective alignment marks is determined in the coordinate system prescribed by the laser interferometer 56. When the alignment marks are detected by the substrate alignment system 5, all of the alignment marks on the substrate P may be detected, or only a part thereof may be detected.

Figure 27:
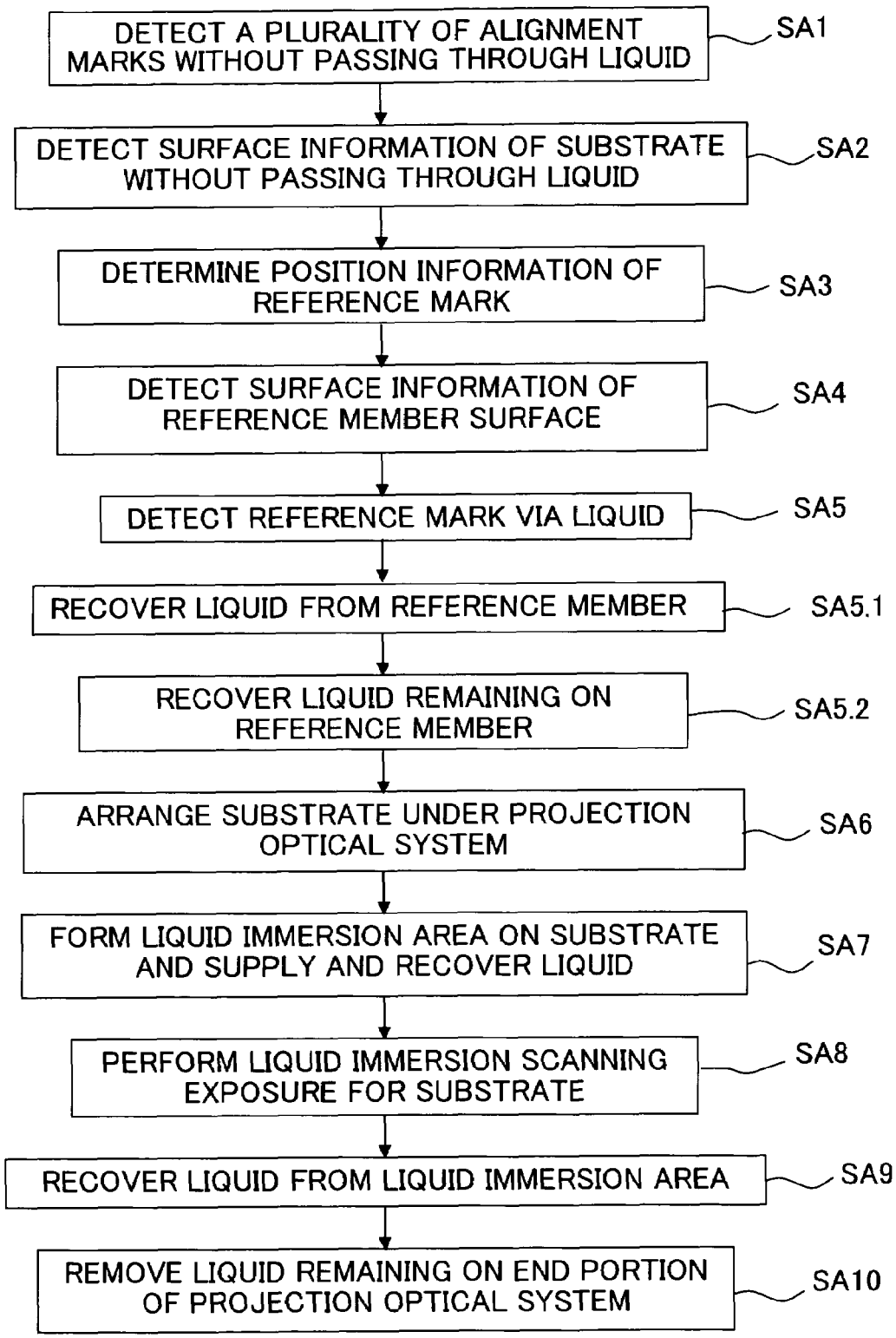
FIG. 27 shows a flow chart illustrating an exemplary exposure procedure with the exposure apparatus according to the present invention.

Further, during the movement of the XY stage 53, the surface information of the substrate P is detected by the focus-detecting system 4 without passing through the liquid 1 (Step SA2, FIG. 27). The surface information is detected by the focus-detecting system 4 for all of the shot areas S1 to S11 on the substrate P respectively. The result of the detection is stored in the control unit CONT while corresponding to the position of the substrate P in the scanning direction (X axis direction). The surface information may be detected by the focus-detecting system 4 for only a part of the shot areas.

When the detection of the alignment mark of the substrate P and the detection of the surface information of the substrate P are completed, the control unit CONT moves the XY stage 53 so that the detection area of the substrate alignment system 5 is positioned on the reference member 7. The substrate alignment system 5 detects the reference mark PFM on the reference member 7 to determine the position information of the reference mark PFM in the coordinate system prescribed by the laser interferometer 56 (Step SA3, FIG. 27).

As a result of the completion of the detection process for the reference mark PFM, the positional relationships between the reference mark PFM and the plurality of alignment marks on the substrate P, i.e., the positional relationships between the reference mark PFM and the plurality of shot areas S1 to S11 on the substrate P are determined respectively. Further, the reference mark PFM and the reference mark MFM are in the predetermined positional relationship. Therefore, the positional relationships between the reference mark MFM and the plurality of shot areas S1 to S11 on the substrate P in the XY plane are determined respectively.

The control unit CONT detects the surface information of the surface (reference surface) of the reference member 7 by using the focus-detecting system 4 before or after the detection of the reference mark PFM by the substrate alignment system 5 (Step SA4, FIG. 27). When the detection process for the surface of the reference member 7 is completed, the relationship between the surface of the reference member 7 and the surface of the substrate P is determined.

Subsequently, the control unit CONT moves the XY stage 53 so that the reference mark MFM on the reference member 7 can be detected by the mask alignment system 6. In this situation, the end portion of the projection optical system PL is opposed to the reference member 7. The control unit CONT starts the supply and the recovery of the liquid 1 by the liquid supply mechanism 10 and the liquid recovery mechanism 30, respectively. The space between the projection optical system PL and the reference member 7 is filled with the liquid 1 to form the liquid immersion area. The size of the reference member 7 in the XY direction is sufficiently larger than the sizes of the supply nozzles 13, 14 and the recovery nozzles 31, 32. The liquid immersion area AR2 is smoothly formed on the reference member 7.

Subsequently, the control unit CONT detects the reference mark MFM via the mask M, the projection optical system PL, and the liquid 1 by using the mask alignment system 6 (Step SA5, FIG. 27). Accordingly, the position of the mask M in the XY plane, i.e., the projection position information of the image of the pattern of the mask M is detected by using the reference mark MFM via the projection optical system PL and the liquid 1.

When the detection process is completed as described above, the control unit CONT stops the operation for supplying the liquid 1 onto the reference member 7 by the liquid supply mechanism 10. On the other hand, the control unit CONT continues, for a predetermined period of time, the operation for recovering the liquid 1 from the surface of the reference member 7 by the liquid recovery mechanism 30 (Step SA5.1). After the predetermined period of time has elapsed, the control unit CONT stops the recovery operation having been performed by the liquid recovery mechanism 30. Further, in order to remove the liquid 1 which is unsuccessfully recovered by the liquid recovery mechanism 30 and which remains on the reference member 7, the substrate stage PST is moved in a direction directed to a blow unit 41 of the first liquid-removing unit 40 as described later on.

Figure 5A:
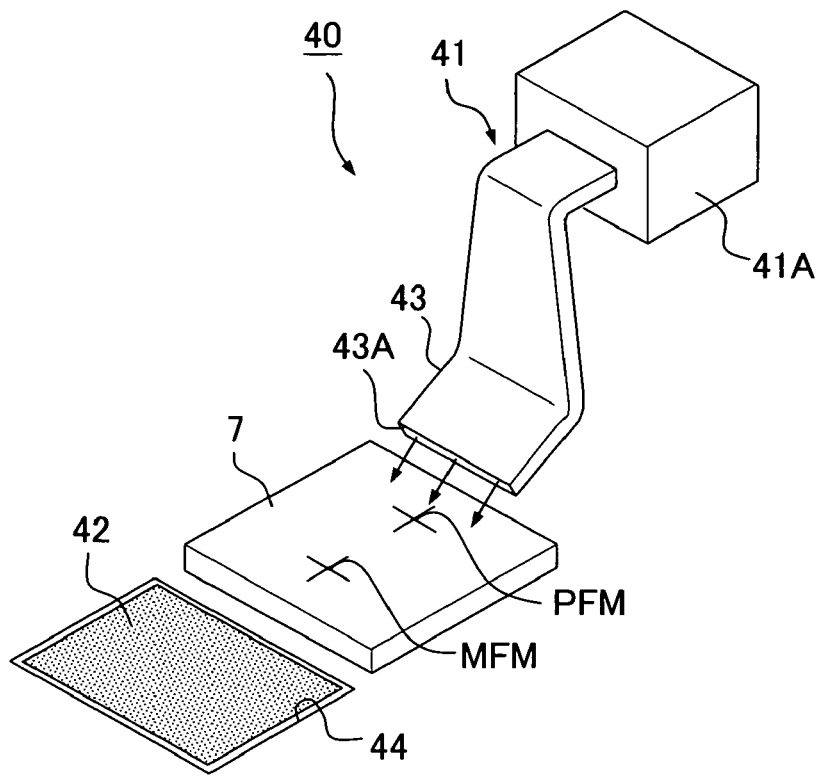
FIGS. 5A and 5B show a schematic arrangement illustrating an example of a first liquid-removing unit as a liquid-removing mechanism.
Figure 5B:
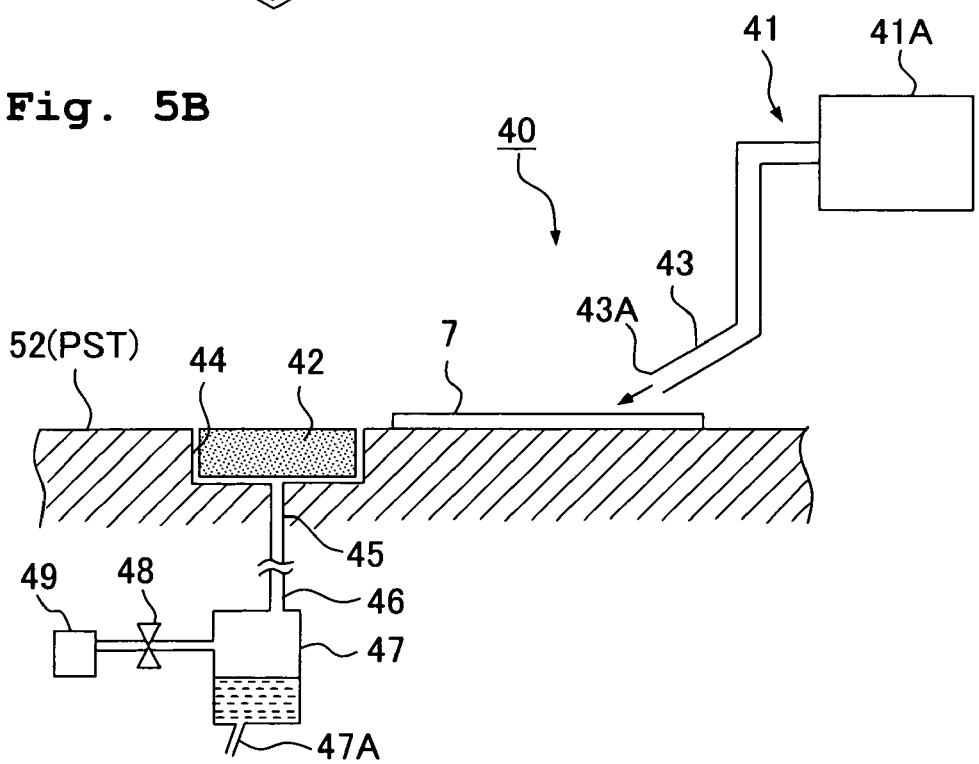

FIG. 5 shows such a situation that the liquid 1, which remains on the reference member 7 provided on the substrate stage PST (Z stage 52), is removed by the first liquid-removing unit 40 which constitutes a part of the liquid-removing mechanism. FIG. 5A shows a schematic perspective view, and FIG. 5B shows a sectional view. With reference to FIG. 5, the first liquid-removing unit 40 includes the blow unit 41 which blows the gas against the reference member 7, and the liquid-absorbing member 42 which is provided adjacently to the reference member 7. The blow unit 41 includes a gas supply section 41A which is capable of feeding the gas, and a nozzle section 43 which is connected to the gas supply section 41A. A blow port 43A of the nozzle section 43 is formed to be slit-shaped so that the blow port 43A is parallel to the in-plane direction of the surface of the reference member 7, which is arranged closely to the reference member 7. The liquid-absorbing member 42 is provided at the position opposed to the blow port 43A of the nozzle section 43 with the reference member 7 intervening therebetween. The gas supply section 41A and the nozzle section 43 are supported by an unillustrated support section which is provided independently from the projection optical system PL. The liquid-absorbing member 42 is arranged in a groove 44 as a recovery port provided in the Z stage 52. The liquid-absorbing member 42 is formed of, for example, a porous material such as a porous ceramics and a sponge, in the same manner as the liquid-absorbing member 21 of the second liquid recovery unit 20, which is capable of retaining a predetermined amount of the liquid 1. The gas is fed from the gas supply section 41A, and thus the high speed gas is allowed to blow against the reference member 7 obliquely from an upper position via the slit-shaped blow port 43A of the nozzle section 43. The control unit CONT allows the gas to blow against the reference member 7 from the nozzle section 43 of the first liquid-removing unit 40. Accordingly, the liquid 1 remaining on the reference member 7 is blown off and removed (Step SA5.2). In this procedure, the control unit CONT allows the gas to blow against the reference member 7 from the nozzle section 43 while moving the substrate stage PST (i.e., the reference member 7) with respect to the nozzle section 43 of the first liquid-removing unit 40. Accordingly, the gas is blown uniformly against the entire surface of the reference member 7. The blown off liquid 1 is retained (recovered) by the liquid-absorbing member 42 which is arranged at the position opposed to the blow port 43A of the nozzle section 43.

As shown in FIG. 5B, a flow passage 45, which is continued to the groove 44, is formed in the Z stage 52. The bottom of the liquid-absorbing member 42 arranged in the groove 44 is connected to the flow passage 45. The flow passage 45, which is connected to the groove 44 arranged with the liquid-absorbing member 42, is connected to one end of a tube passage 46 which is provided outside the Z stage 52. On the other hand, the other end of the tube passage 46 is connected to a pump 49 as a sucking unit via a valve 48 and a tank 47 provided outside the Z stage 52. The first liquid-removing unit 40 drives the gas supply section 41A and drives the pump 49 so that the liquid 1 recovered by the liquid-absorbing member 42 is sucked to collect the liquid 1 in the tank 47. The tank 47 is provided with a discharge flow passage 47A. When a predetermined amount of the liquid 1 is pooled in the tank 47, the liquid 1 contained in the tank 47 is discharged to the outside via the discharge flow passage 47A.

Subsequently, the control unit CONT moves the XY stage 53 so that the substrate P is arranged under the projection optical system PL in order to expose the respective shot areas S1 to S11 on the substrate P (Step SA6, FIG. 27). The control unit CONT drives the liquid supply mechanism 10 to start the operation for supplying the liquid onto the substrate P in the state in which the substrate P is arranged under the projection optical system PL. The liquid 1, which is fed from the first and second liquid supply sections 11, 12 of the liquid supply mechanism 10 respectively in order to form the liquid immersion area AR2, flows through the supply tubes 11A, 12A, and then the liquid 1 is supplied onto the substrate P via the first and second supply nozzles 13, 14 to form the liquid immersion area AR2 between the projection optical system PL and the substrate P. In this situation, the supply ports of the first and second supply nozzles 13, 14 are arranged on the both sides in the X axis direction (scanning direction) of the projection area AR1. The control unit CONT simultaneously supplies the liquid 1 onto the substrate P on the both sides of the projection area AR1 from the supply ports of the liquid supply mechanism 10. Accordingly, the liquid 1, which is supplied onto the substrate P, forms, on the substrate P, the liquid immersion area AR2 in a range wider than at least the projection area AR1. Further, the control unit CONT controls the first and second liquid recovery sections 33, 34 of the liquid recovery mechanism 30 to perform the operation for recovering the liquid from the surface of the substrate P concurrently with the operation for supplying the liquid 1 performed by the liquid supply mechanism 10. In other words, the control unit CONT simultaneously performs the liquid supply by the liquid supply mechanism 10 and the liquid recovery by the liquid recovery mechanism (first liquid recovery mechanism) 30 in order to form the liquid immersion area AR2 during the exposure for the substrate P (Step SA7, FIG. 27). Accordingly, the liquid 1 on the substrate P, which flows to the outside of the projection area AR1 from the supply ports of the first and second supply nozzles 13, 14, is recovered by the recovery ports of the first and second recovery nozzles 31, 32. As described above, the liquid recovery mechanism 30 recovers the liquid 1 from the surface of the substrate P through the recovery ports provided to surround the projection area AR1.

The respective shot areas S1 to S11 on the substrate P are subjected to the scanning exposure by using the respective pieces of information determined during the detection process as described above (Step SA8, FIG. 27). That is, the respective shot areas S1 to S11 on the substrate P and the mask M are subjected to the positional adjustment during the scanning exposure for the respective shot areas respectively on the basis of the information about the positional relationships between the reference mark PFM and the respective shot areas S1 to S11 determined before the supply of the liquid 1, and the information about the projection position of the image of the pattern of the mask M determined by using the reference mark MFM after the supply of the liquid 1.

The positional relationship is adjusted between the surface of the substrate P and the image plane formed via the liquid 1 during the scanning exposure for the respective shot areas S1 to S11 on the basis of the surface information of the substrate P determined before the supply of the liquid 1 and the surface information of the surface of the substrate P detected by using the focus-detecting system 4 during the scanning exposure.

In this embodiment, when the liquid 1 is supplied to the substrate P from the both sides of the projection area AR1 in the scanning direction, the control unit CONT controls the liquid supply operation of the first and second liquid supply sections 11, 12 of the liquid supply mechanism 10 so that the liquid supply amount per unit time, which is to be supplied in front of the projection area AR1 in relation to the scanning direction, is set to be larger than the liquid supply amount to be supplied on the side opposite thereto. For example, when the exposure process is performed while moving the substrate P in the +X direction, the control unit CONT is operated so that the liquid amount from the −X side with respect to the projection area AR1 (i.e., from the first supply nozzle 13) is made larger than the liquid amount from the +X side (i.e., from the second supply nozzle 14). On the other hand, when the exposure process is performed while moving the substrate P in the −X direction, the liquid amount from the +X side with respect to the projection area AR1 is made larger than the liquid amount from the −X side.

When the scanning exposure is completed for the respective shot areas S1 to S11 on the substrate P, then the control unit CONT stops the supply of the liquid by the liquid supply mechanism 10, and the substrate stage PST is moved so that the recovery port 23 of the second liquid recovery unit 20 provided for the substrate stage PST is opposed to the projection optical system PL. The control unit CONT uses, in combination, the liquid recovery mechanism (first liquid recovery mechanism) 30 and the second liquid recovery unit 20 to recover the liquid 1 existing under the projection optical system PL (Step SA9). In this manner, the liquid 1 of the liquid immersion area AR2 is recovered simultaneously by using the liquid recovery mechanism (first liquid recovery unit) 30 having the recovery port arranged over the substrate stage PST and the second liquid recovery unit 20 having the recovery port arranged on the substrate stage PST. Therefore, it is possible to suppress the liquid 1 from remaining on the substrate P and the end portion of the projection optical system PL.

The second liquid recovery unit 20 recovers the liquid 1 of the liquid immersion area AR2 after the completion of the exposure for the substrate P. However, the liquid 1, which outflows to the outside of the substrate P (auxiliary plate 57), may be recovered during the liquid immersion exposure. The recovery port 23 of the second liquid recovery unit 20 is provided in the zonal (annular) form around the substrate P. However, the recovery port 23 may be provided partially at a predetermined position in the vicinity of the substrate P (auxiliary plate 57) considering the movement direction of the substrate stage PST after the completion of the exposure for the substrate P. The liquid immersion exposure itself is not affected even when the vibration, which is accompanied by the recovery operation, is increased before and after the liquid immersion exposure. Therefore, in this period, the recovery power of the liquid recovery mechanism 30 may be increased as compared with the power brought about during the liquid immersion exposure.

When the liquid 1 on the substrate P is unsuccessfully recovered after the completion of the liquid immersion exposure, the substrate P may be dealt with as follows, although the substrate P is not a part. That is, for example, the substrate stage PST, which supports the substrate P, is moved to arrange the substrate P at a position separated from the projection optical system PL, specifically at a position under the blow unit 41 of the first liquid-removing unit 40. The gas is blown against the substrate P to remove the liquid. The blown off liquid 1 can be collected in the tank 47 by effecting the suction with the pump 42 by the aid of the liquid-absorbing member. Alternatively, the blown off liquid 1 may be recovered by the second liquid recovery unit 20 of course, the gas blow operation can be performed not only for the substrate P but also for the surfaces of the auxiliary plate 57 and the Z stage 52 disposed outside the auxiliary plate 57.

As described above, the first liquid recovery unit 40 removes the liquid 1 remaining on the reference member 7. However, it is also possible to remove the liquid 1 remaining on any part (area) other than the reference member 7 on the substrate stage PST. For example, when the liquid 1 is subjected to the outflow and/or the scattering to the outside of the substrate P during the liquid immersion exposure, and the liquid 1 is adhered onto the substrate stage PST (Z stage 52), then the liquid 1 on the substrate stage PST can be recovered by the first liquid-removing unit 40 after the completion of the exposure for the substrate P. In this case, the liquid 1, which has been blown off by the blow unit 41 of the first liquid-removing unit 40, may be recovered by the liquid-absorbing member 21 arranged in the groove (recovery port) 23 of the second liquid recovery unit 20.

The nozzle section 43 of the blow unit 41 may be previously provided movably with respect to the substrate stage PST. The liquid 1, which has flown out to the outside of the substrate P, may be recovered during the exposure and/or after the completion of the exposure for the substrate P.

As explained above, the first liquid-removing unit 40 is provided, which removes the liquid 1 remaining on the reference member 7 provided on the substrate stage PST (Z stage 52). Therefore, it is possible to prevent the liquid 1 from remaining on the reference member 7. Further, the liquid 1 is recovered by using the recovery port on the substrate stage PST as well after the completion of the exposure for the substrate P. Therefore, it is possible to prevent the liquid 1 from remaining on the substrate P and/or at the end portions of the nozzle and the projection optical system PL, and it is possible to prevent the liquid 1 from falling and scattering to the substrate or the like. In the embodiment described above, the first liquid-removing unit 40 has the liquid-absorbing member 42 arranged in the vicinity of the reference member 7. However, the liquid-absorbing member 42 may be omitted. In this case, the liquid 1, which has been removed from the surface of the reference member 7, may be allowed to remain in a predetermined area on the substrate stage PST at which the exposure operation and the measuring operation are not affected thereby as well.

Figure 6:
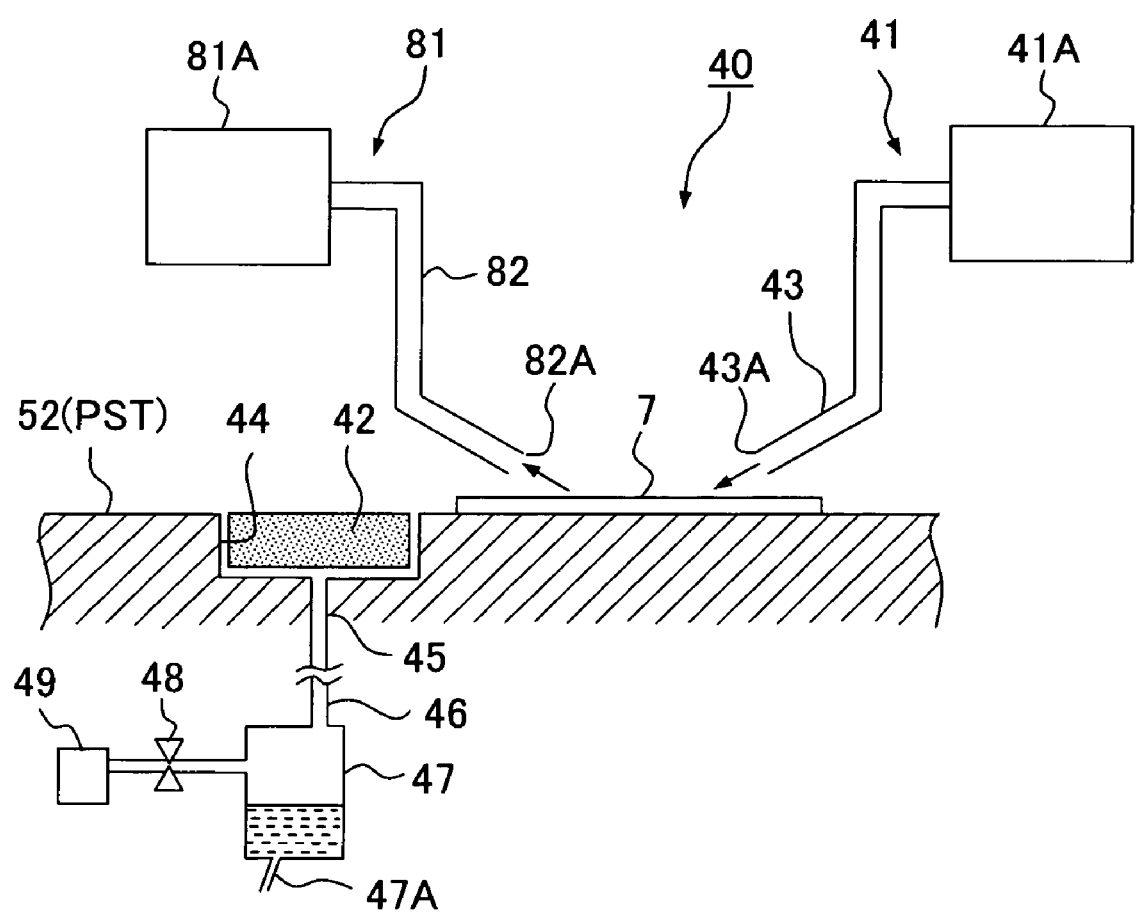
FIG. 6 shows a schematic arrangement illustrating an example of a first liquid-removing unit as a liquid-removing mechanism.

FIG. 6 shows another embodiment of the first liquid-removing unit 40. In the following description, the same or equivalent constitutive portions as those of the embodiment described above will be designated by the same reference numerals, any explanation of which will be simplified or omitted. With reference to FIG. 6, the first liquid-removing unit 40 is provided with a sucking unit 81 which sucks the liquid 1 adhered onto the reference member 7. The sucking unit 81 is arranged at a position opposed to the blow unit 41 to interpose the reference member 7 therebetween. The sucking unit 81 includes a sucking section 81A which includes a tank and a pump, and a sucking nozzle 82 which is connected to the sucking section 81A. A sucking port 82A of the sucking nozzle 82 is arranged closely to the reference member 7. When the liquid 1 remaining on the reference member 7 is removed, then the blow unit 41 blows the gas against the reference member 7, and the sucking unit 81 sucks the liquid 1 from the surface of the reference member 7.

In the illustrative embodiment explained with reference to FIG. 6, the first liquid-removing unit 40 is provided with both of the blow unit 41 and the sucking unit 81. However, it is also allowable to adopt an arrangement in which only the sucking unit 81 is provided. The sucking unit 81 sucks the liquid 1 remaining on the reference member 7 from the sucking port 82A, and thus the liquid 1 can be removed (recovered). The nozzle section 82 of the sucking unit 81 may be provided movably with respect to the substrate stage PST to recover the liquid 1 flown out to the outside of the substrate P during the exposure and/or after the completion of the exposure for the substrate P. In the embodiment shown in FIG. 6, the first liquid-removing unit 40 has the liquid-absorbing member 42 arranged in the vicinity of the reference member 7. However, the liquid-absorbing member 42 may be omitted.

Figure 7:
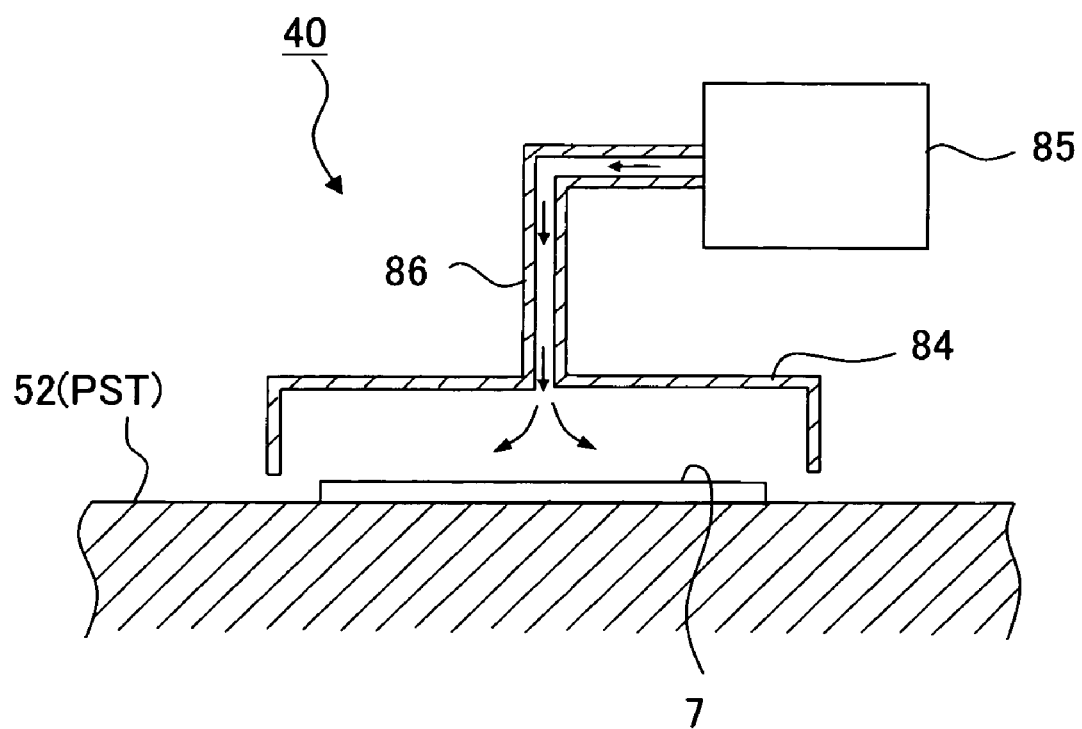
FIG. 7 shows a schematic arrangement illustrating an example of a first liquid-removing unit as a liquid-removing mechanism.

FIG. 7 shows a sectional view illustrating still another embodiment of the first liquid-removing unit 40. As shown in FIG. 7, the first liquid-removing unit 40 includes a cover member 84 which covers the reference member 7, and a dry gas supply section 85 which supplies the dry gas to the internal space of the cover member 84. The dry gas supply section 85 supplies the dry gas to the internal space of the cover member 84 arranged over the reference member 7 via a tube passage 86. Accordingly, the vaporization of the liquid 1 remaining on the reference member 7 is facilitated, and thus the liquid 1 is removed. The first liquid-removing unit 40 removes the liquid on the part such as the reference member 7 carried on the substrate stage PST. However, when the exposure apparatus EX carries a stage provided with a reference section and/or a measuring member separately from the substrate stage PST as disclosed in Japanese Patent Application Laid-open No. 11-135400, the liquid on the part on the stage can be also removed.

Figure 8:
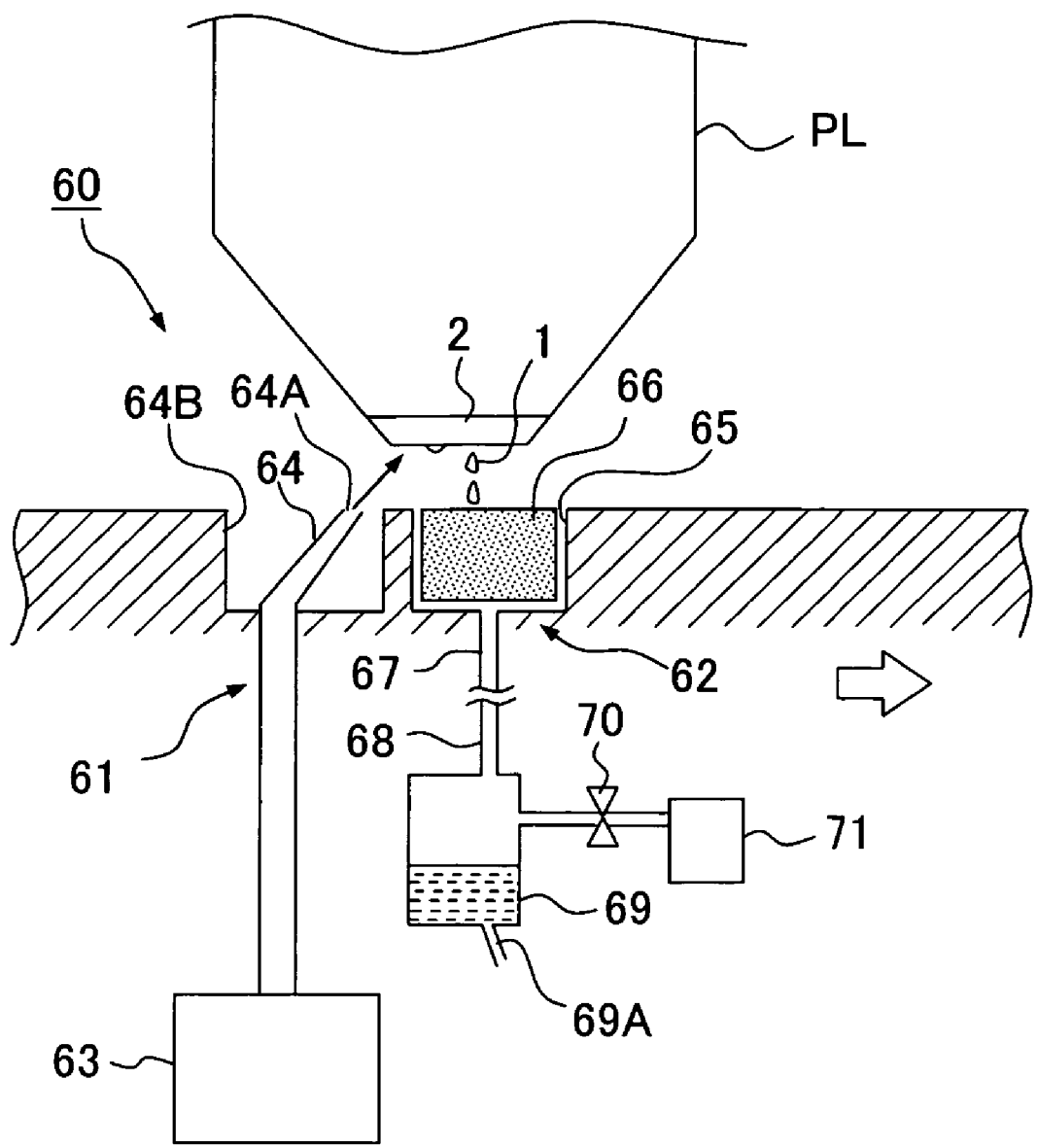
FIG. 8 shows a schematic arrangement illustrating an example of a second liquid-removing unit as a liquid-removing mechanism.

Next, an explanation will be made with reference to FIG. 8 about the second liquid-removing unit 60 for removing the liquid 1 or the like remaining on the barrel PK disposed in the vicinity of the end portion and/or the optical element 2 disposed at the end portion of the projection optical system PL. With reference to FIG. 8, the second liquid-removing unit 60 includes a blow unit 61 which blows the gas against the optical element 2 for constructing the part disposed at the end portion of the projection optical system PL and the barrel PK disposed in the vicinity thereof, and a recovery unit (sucking unit) 62 which recovers the fallen liquid blown off by the gas blow effected by the blow unit 61. The blow unit 61 includes a gas supply section 63, and a nozzle section 64 which is connected to the gas supply section 63 and which is provided in a recess 64B of the Z stage 52. The nozzle section 64 has a blow port 64A which is directed upwardly and which is capable of being arranged in the vicinity of the end portion of the projection optical system PL. On the other hand, the recovery unit 62 includes a recovery port (groove) 65 which is provided in the Z stage 52, a liquid-absorbing member 66 which is formed of a porous material arranged in the recovery port 65, a flow passage 67 which is arranged in the Z stage 52 and which is communicated with the groove 66, a tube passage 68 which is provided outside the Z stage 52 and which has one end connected to the flow passage 67, a tank 69 which is connected to the other end of the tube passage 68 and which is provided outside the Z stage 52, and a pump 71 as a sucking unit which is connected to the tank 69 via a valve 70. The recovery unit 62 drives the pump 71 to suck the liquid 1 recovered by the liquid-absorbing member 66 so that the liquid 1 is collected in the tank 69. The tank 69 is provided with a discharge flow passage 69A. When a predetermined amount of the liquid 1 is pooled in the tank 69, the liquid 1 contained in the tank 69 is discharged to the outside via the discharge flow passage 69A.

In this embodiment, the blow port 64A of the nozzle section 64 of the blow unit 61 is slit-shaped, in which the Y axis direction is the longitudinal direction (see FIG. 3). The recovery port 65 of the recovery unit 62 is formed to have a rectangular shape in which the Y axis direction is the longitudinal direction at the position adjoining on the +X side of the blow port 64A. The second liquid-removing unit 60 removes the liquid 1 remaining on the end portion of the projection optical system PL allowed to make contact with the liquid 1 in the liquid immersion area AR2 during the exposure for the substrate P as well as on the supply nozzles (parts) 13, 14 of the liquid supply mechanism 10 and the recovery nozzles (parts) 31, 32 of the liquid recovery mechanism 30 after the completion of the exposure for the substrate P. Of course, it is also possible to remove the liquid from only the end portion of the projection optical system PL or from only the nozzles.

As described above, the control unit CONT recovers the liquid 1 from the surface of the substrate P (Step SA9, FIG. 27) by using the liquid recovery mechanism (first liquid recovery unit) 30 after the completion of the liquid immersion exposure for the substrate P (after the completion of Step SA8). After the completion of the recovery of the liquid 1 from the surface of the substrate P by the liquid recovery mechanism 30, the control unit CONT moves the substrate stage PST so that the second liquid-removing unit 60 is arranged under the projection optical system PL. The second liquid-removing unit 60 allows the gas to blow from the nozzle section 64 of the blow unit 61 arranged obliquely downwardly with respect to the end portion of the projection optical system PL. The liquid 1, which remains on the end portion of the projection optical system PL, is blown off and removed (Step SA10, FIG. 27). The blown off liquid 1 falls onto the liquid-absorbing member 66 disposed adjacently to the nozzle section 64. The liquid 1 is recovered by the recovery port 65 arranged with the liquid-absorbing member 66 of the recovery unit 62. In this embodiment, the control unit CONT drives the second liquid-removing unit 60 while moving the substrate stage PST, for example, in the X axis direction perpendicular to the longitudinal direction (Y axis direction) of the recovery port 65 and the blow port 64A. Accordingly, the gas is allowed to blow against the end portion of the projection optical system PL as a matter of course, as well as against the recovery nozzles 31, 32 of the liquid recovery mechanism 30 and the supply nozzles 13, 14 of the liquid supply mechanism 10 disposed therearound. It is possible to remove the liquid 1 remaining on the supply nozzles 13, 14 and the recovery nozzles 31, 32 as well.

Figure 9:
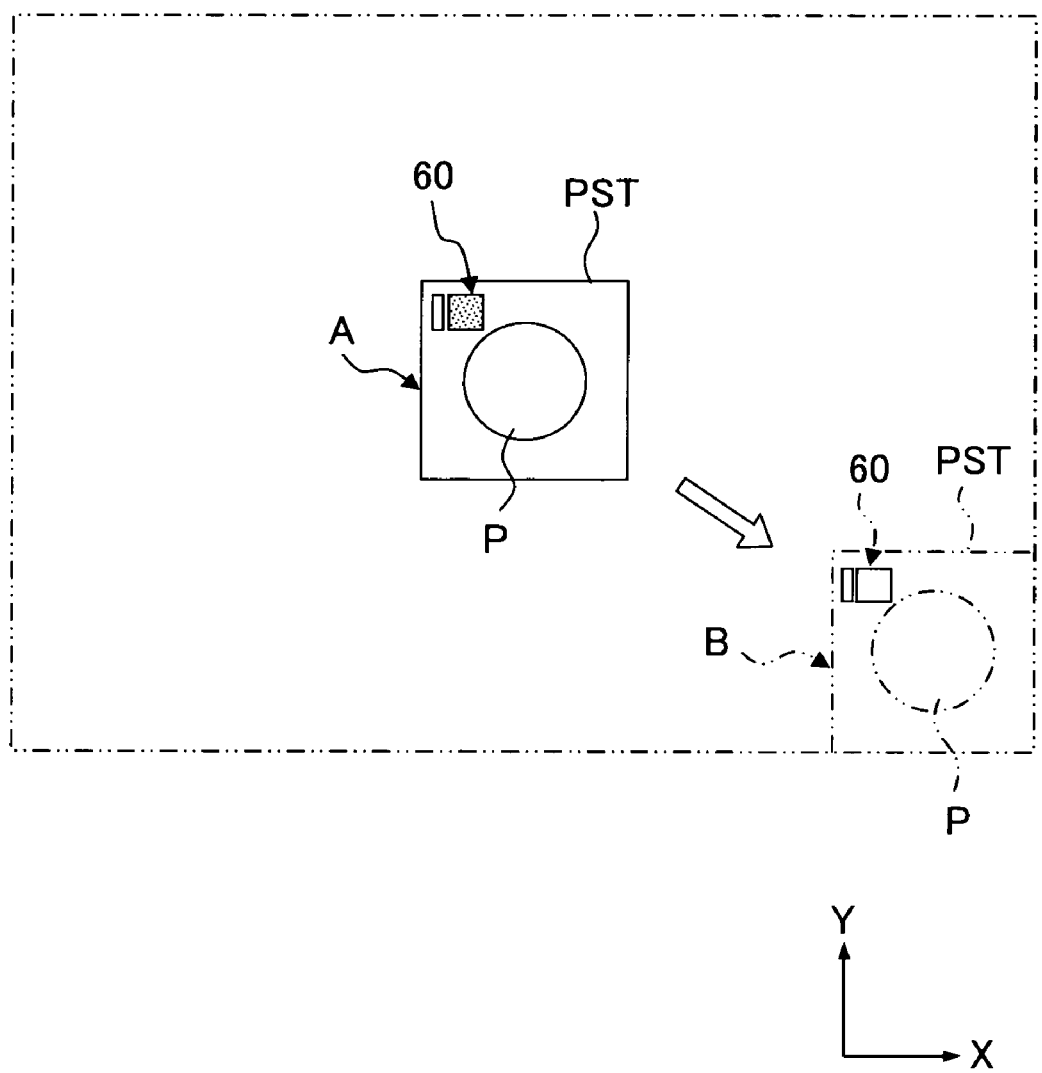
FIG. 9 schematically illustrates a situation of movement of the substrate stage.

As explained above, the liquid 1, which remains on the end portion of the projection optical system PL allowed to make contact with the liquid 1 in the liquid immersion area AR2 during the exposure as well as on the supply nozzles 13, 14 and the recovery nozzles 31, 32, is removed. Accordingly, as schematically shown in FIG. 9, even when the substrate stage PST is moved from the position under the projection optical system PL (exposure process position A) to the position (load/unload position B) at which the substrate P is loaded and/or unloaded, it is possible to suppress the occurrence of any inconvenience which would be otherwise caused such that the liquid 1, which remains, for example, on the end portion of the projection optical system PL, falls to affect the surrounding equipment and brings about the environmental change. In particular, it is possible to suppress the occurrence of the adhesion trace (water mark) by preventing the liquid 1 from remaining on the optical element 2 disposed at the end portion of the projection optical system PL.

Further, the second liquid-removing unit 60 is provided for the substrate stage PST. Accordingly, when the second liquid-removing unit 60 is driven while moving the substrate stage PST, the gas can be allowed to blow against the projection optical system PL, the supply nozzles, and the recovery nozzles while scanning the second liquid-removing unit 60, even when any actuator is not provided. Further, for example, as shown in FIG. 9, the operation for blowing the gas is performed by the second liquid-removing unit 60 during the period of the movement from the exposure process position A to the load/unload position B after the completion of the liquid immersion exposure. Accordingly, it is possible to simultaneously perform the liquid-removing operation (gas-blowing operation) and the stage-moving operation. It is possible to improve the time efficiency of the series of the exposure process. Therefore, it is preferable that the second liquid-removing unit 60 is previously provided at the position to pass under the projection optical system PL during the movement of the substrate stage PST from the exposure process position A to the load/unload position B.

Figure 10:
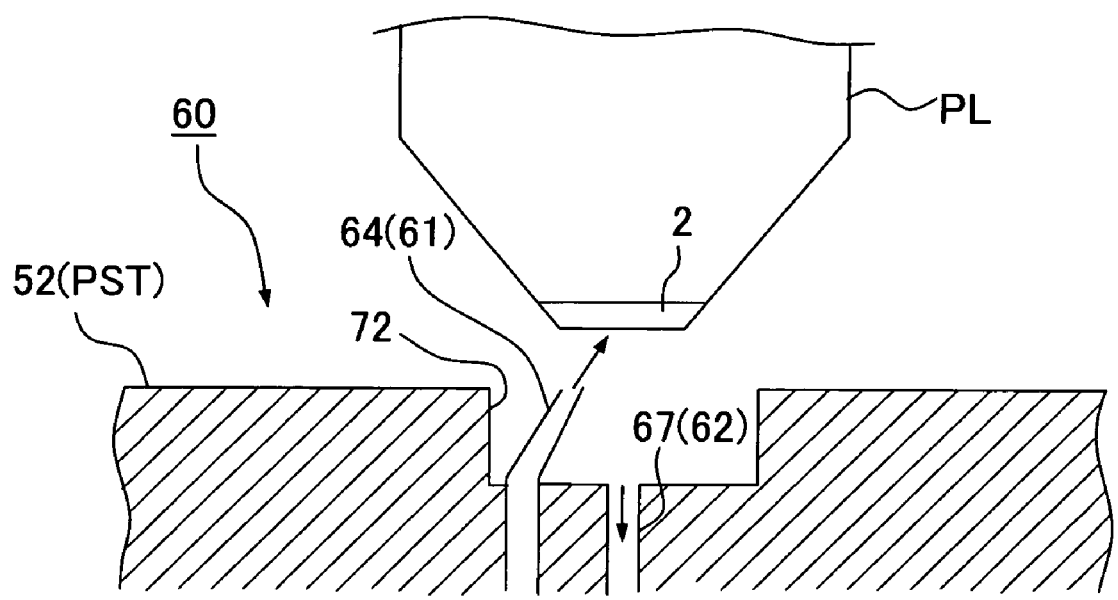
FIG. 10 shows a schematic arrangement illustrating an example of a second liquid-removing unit as a liquid-removing mechanism.
Figure 11:
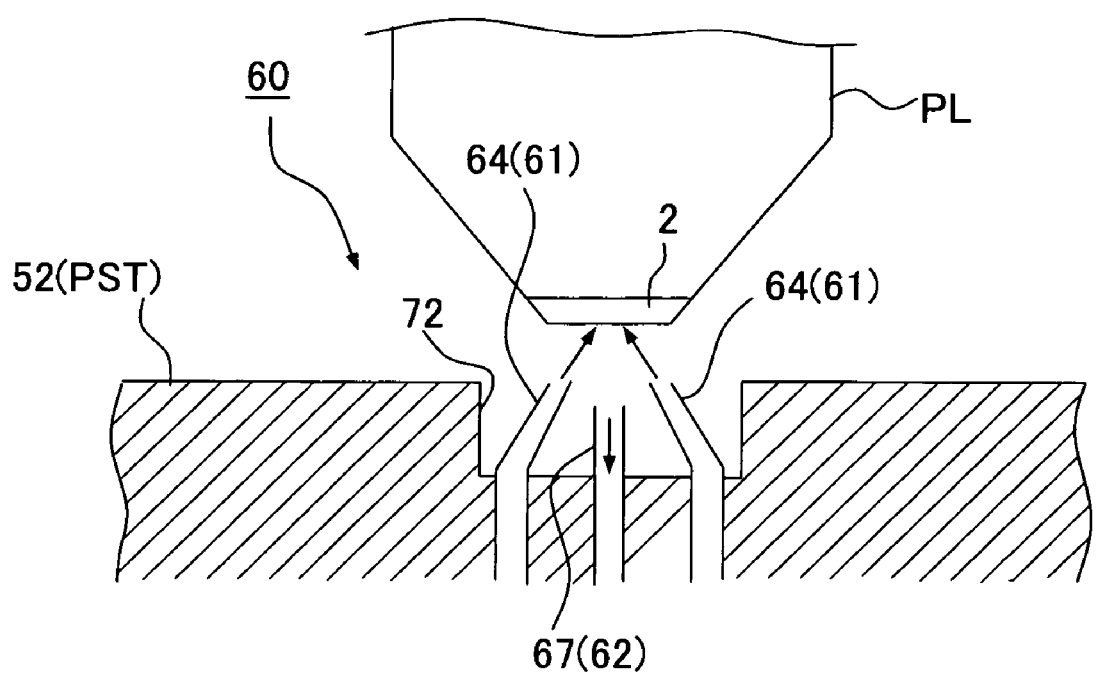
FIG. 11 shows a schematic arrangement illustrating an example of a second liquid-removing unit as a liquid-removing mechanism.

FIGS. 10 and 11 show modified embodiments of the second liquid-removing unit 60. As shown in FIG. 10, a large groove 72 is formed on the Z stage 52 beforehand. The nozzle section 64 of the blow unit 61 and the flow passage (recovery port) 67 of the recovery unit 62 may be arranged in the groove 72. In the illustrative embodiment shown in FIG. 10, the liquid-absorbing member 66 is not provided. As described above, it is also possible to adopt the arrangement in which the liquid-absorbing member 66 is not provided. Alternatively, as shown in FIG. 11, a plurality of nozzle sections 64 (two nozzle sections 64, in the illustrative embodiment shown in FIG. 11) of the blow unit 61 may be provided in the groove. Further, as exemplified in the illustrative embodiments shown in FIGS. 10 and 11, the groove 72, which is larger than the size (width) of the end portion of the projection optical system PL, is provided, and the nozzle section 64 and the recovery port 67 are arranged in the groove 72. Accordingly, all of the liquid 1, which falls as a result of the blow of the gas, can be recovered by the groove 72. Therefore, it is possible to suppress the scattering of the liquid 1 to the surroundings.

Figure 12:
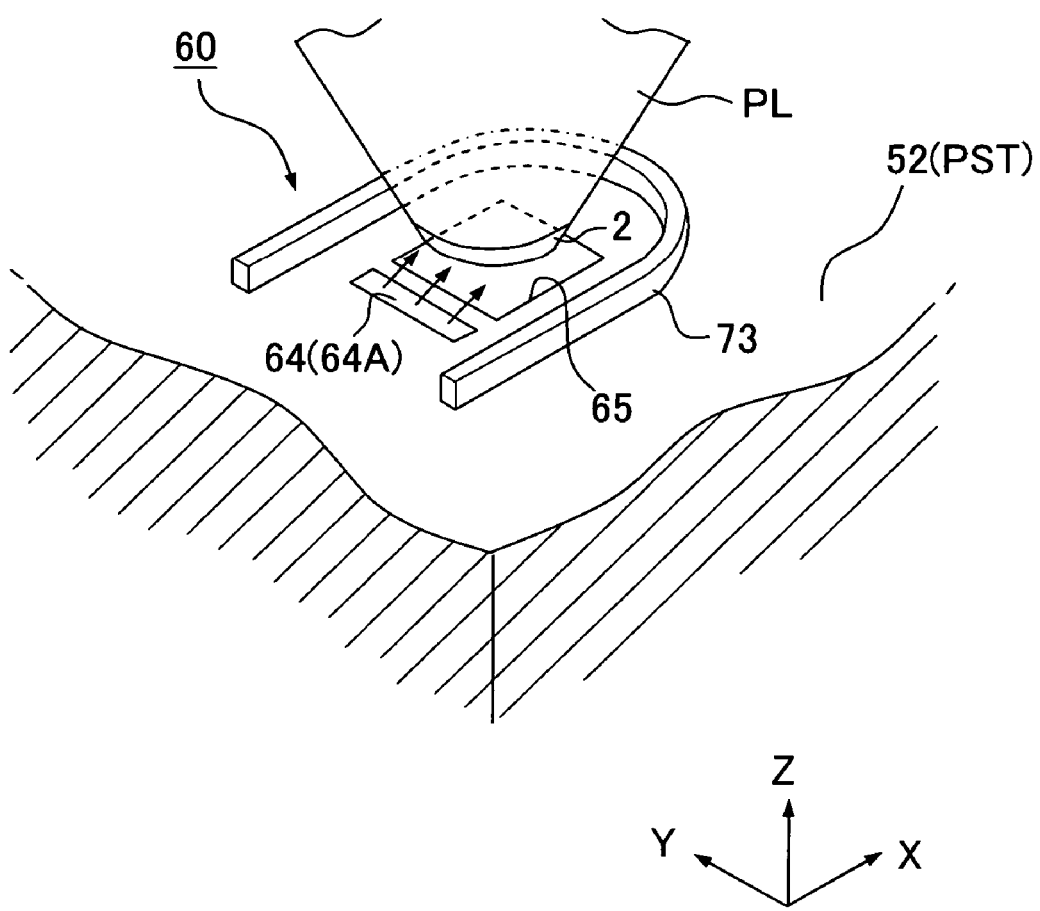
FIG. 12 shows a schematic arrangement illustrating an example of a second liquid-removing unit as a liquid-removing mechanism.

Alternatively, as shown in FIG. 12, a cover member 73, which prevents the liquid 1 subjected to the gas blow from being scattered to the surroundings, can be provided around the recovery port 65 and the blow port 64A of the nozzle section 64. The cover member 73 shown in FIG. 12 is formed to be U-shaped as viewed in a plan view so that the cover member 73 can be arranged to surround the end portion of the projection optical system PL. The cover member 73 is formed so that the blow port 64A of the nozzle section 64 is arranged on the side of the opening of the U-shaped form. Further, the cover member 73 is formed so that the side of the opening of the U-shaped form of the cover member 73 faces the movement direction of the substrate stage PST (X axis direction). The end portion of the projection optical system PL enters and exists the inside of the cover member 73 on the side of the opening of the U-shaped form. The blow port 64A and the recovery port 65, for each of which the Y axis direction is the longitudinal direction, are provided inside the cover member 73. Accordingly, the liquid can be efficiently removed, for example, from the end portion of the projection optical system PL while avoiding the scattering of the liquid 1 by one time of the scanning movement of the substrate stage PST.

The liquid 1, which outflows to the outside of the substrate P, can be also recovered during the exposure for the substrate P by the aid of the recovery port 65 of the recovery unit 62 of the second liquid-removing unit 60. In this arrangement, it is preferable that a plurality of recovery ports 65 of the recovery unit 62 are provided at predetermined intervals around the substrate P.

In the embodiments shown in FIGS. 8 to 12, the second liquid-removing unit 60 is provided with the recovery unit 62 in the vicinity of the nozzle section 64. However, the recovery unit 62 may be omitted. In this arrangement, the liquid 1, which is removed from the end portion of the projection optical system PL, can be also allowed to remain in a predetermined area on the substrate stage PST in which no influence is exerted on the exposure operation and the measuring operation.

In the embodiments shown in FIGS. 8 to 12, the second liquid-removing unit 60 is arranged on the substrate stage PST. However, the second liquid-removing unit 60 may be arranged on a portion or a member different from the substrate stage PST. For example, a stage, which is movable on the side of the image plane of the projection optical system PL, may be further provided independently from the substrate stage PST, and the second liquid-removing unit 60 may be arranged on the stage.

A sucking port may be provided in the vicinity of the projection optical system PL, the supply nozzle, the recovery nozzle, and/or the blow port 64A of the nozzle section 64 of the second liquid-removing unit 60. Alternatively, a sucking port may be provided in place of the blow port 64A to recover the liquid adhered to the forward end surface of the projection optical system PL, the supply nozzle, and/or the recovery nozzle.

Even when the liquid 1 is removed from the end portion of the projection optical system PL, then impurities and/or foreign matters, which are contained in the liquid 1, may adhere to the optical element 2 disposed at the end portion of the projection optical system PL, and the optical element 2 may be contaminated therewith in some cases. The impurities and/or foreign matters herein include, for example, broken pieces of the photoresist and deposits of the electrolyte contained in the photoresist. Accordingly, it is preferable to wash the optical element 2 before or after removing (blowing off or sucking) the liquid 1 remaining on the optical element 2 disposed at the end portion of the projection optical system PL.

Figure 13:
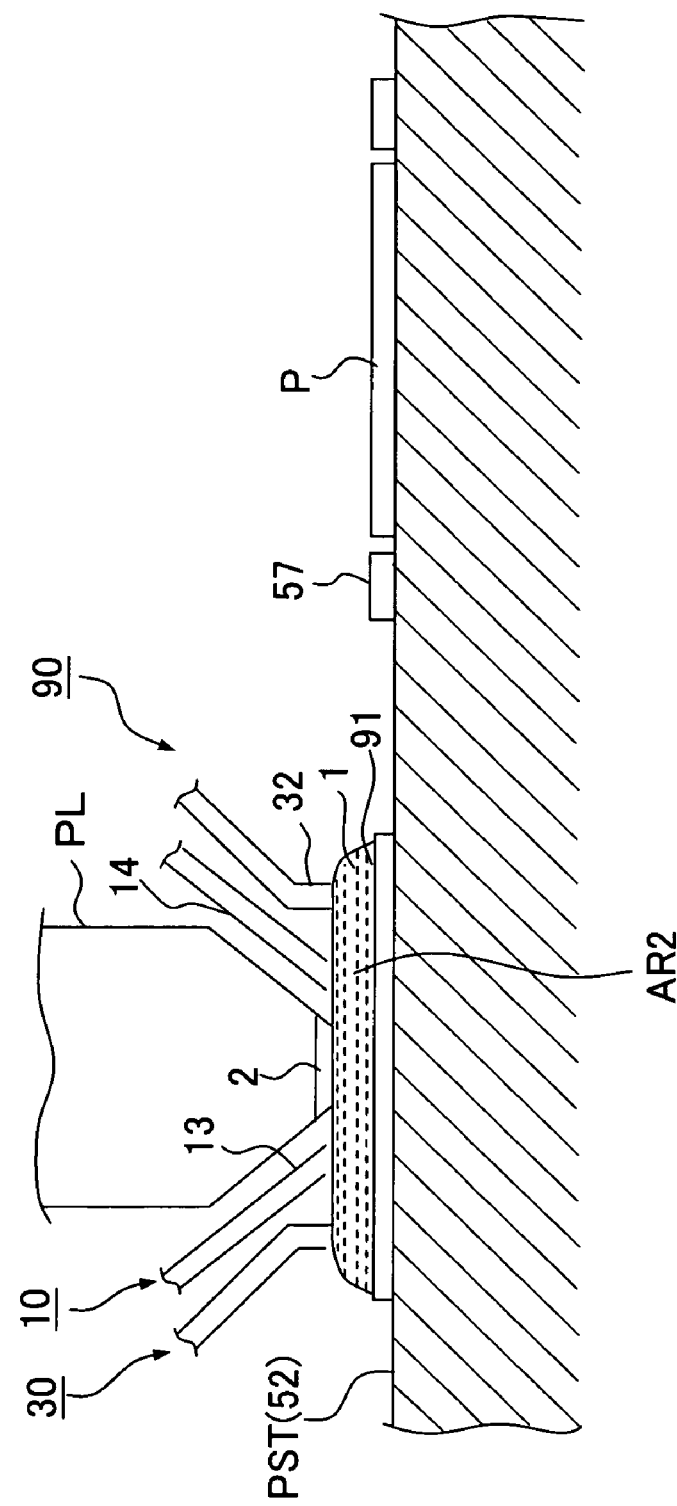
FIG. 13 schematically shows an example of a washing mechanism.

FIG. 13 schematically shows a state in which the end portion of the projection optical system PL is washed. In an embodiment shown in FIG. 13, a washing station 90 is provided at a position different from that of the substrate P held by the substrate holder, on the substrate stage PST (Z stage 52). A washing plate 91 is provided for the washing station 90. The washing plate 91 is, for example, a plate member having substantially the same size as that of the substrate P.

In order to wash the optical element 2 disposed at the end portion of the projection optical system PL after (or before) the completion of the liquid immersion exposure, the control unit CONT moves the substrate stage PST to arrange the washing plate 91 (washing station 90) under the projection optical system PL. The control unit CONT drives the liquid supply mechanism 10 and the liquid recovery mechanism 30 to form the liquid immersion area AR2 between the projection optical system PL and the washing plate 91. The optical element 2, which is disposed at the end portion of the projection optical system PL, is washed with the liquid 1 in the liquid immersion area AR2 formed on the washing plate 91. After the washing process comes to an end, the second liquid-removing unit 60 is used as described above to remove the liquid 1 remaining on the optical element 2 disposed at the end portion of the projection optical system PL.

Figure 14:
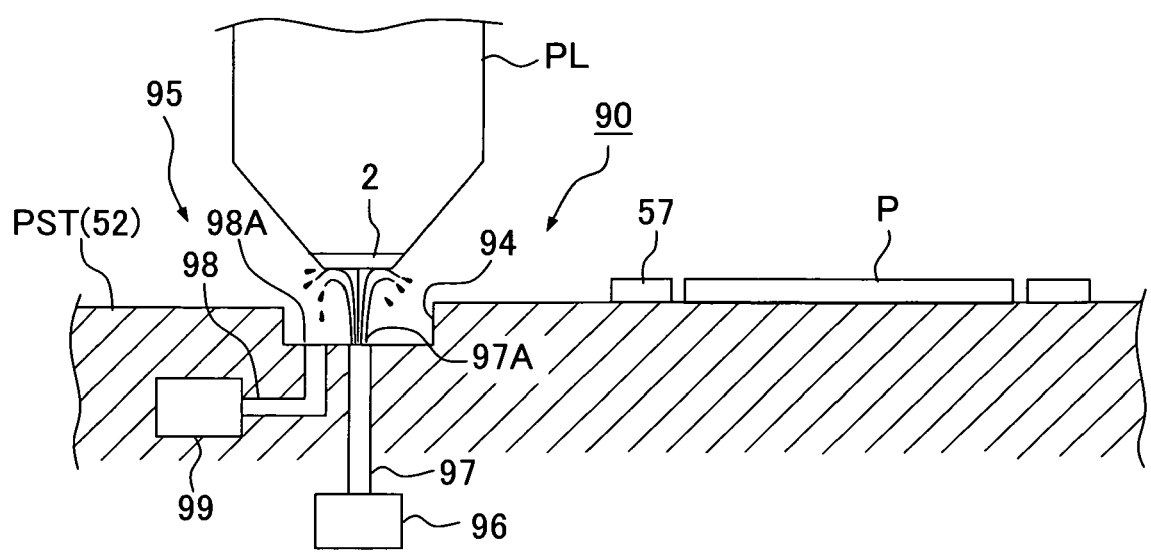
FIG. 14 schematically shows an example of a washing mechanism.

In the case of the washing station 90 shown in FIG. 13, the liquid supply mechanism 10 and the liquid recovery mechanism 30 are used to form the liquid immersion area AR2 on the washing plate 91, and the optical element 2 disposed at the end portion of the projection optical system PL is washed with the liquid 1 in the liquid recovery amount AR2. However, as shown in FIG. 14, a washing mechanism 95 may be provided for the washing station 90, and the washing mechanism 95 can be used to wash the optical element 2 disposed at the end portion of the projection optical system PL. The washing mechanism 95 of the washing station 90 shown in FIG. 14 includes a washing liquid supply section 96, a jetting section 97 which is connected to the washing liquid supply section 96 and which has a jetting port 97A for jetting or spouting the washing liquid fed from the washing liquid supply section 96 to the optical element 2 disposed at the end portion of the projection optical system PL, a recovery tube 98 which has a recovery port 98A for recovering the waste liquid after washing the optical element 2, and a recovery section 99 which is connected to the recovery tube 98 and which includes, for example, a pump and a tank. The jetting port 97A and the recovery port 98A are arranged in a groove 94 formed on the substrate stage PST (Z stage 52). After the completion of the liquid immersion exposure, the washing station 90 is arranged under the projection optical system PL, and the washing liquid is jetted or spouted toward the optical element 2 disposed at the end portion of the projection optical system PL by using the jetting section 97 of the washing mechanism 95. Accordingly, the optical element 2 is washed. In this arrangement, the washing liquid is prevented from the scattering to the surroundings by arranging the jetting port 97A and the recovery port 98A in the groove 94.

The washing station 90 (washing plate 91) is arranged on the substrate stage PST. However, the washing station 90 (washing plate 91) may be arranged on a member different from the substrate stage PST. For example, a stage, which is movable on the side of the image plane of the projection optical system PL, may be further provided independently from the substrate stage PST, and the washing station may be arranged on the stage.

Figure 15:
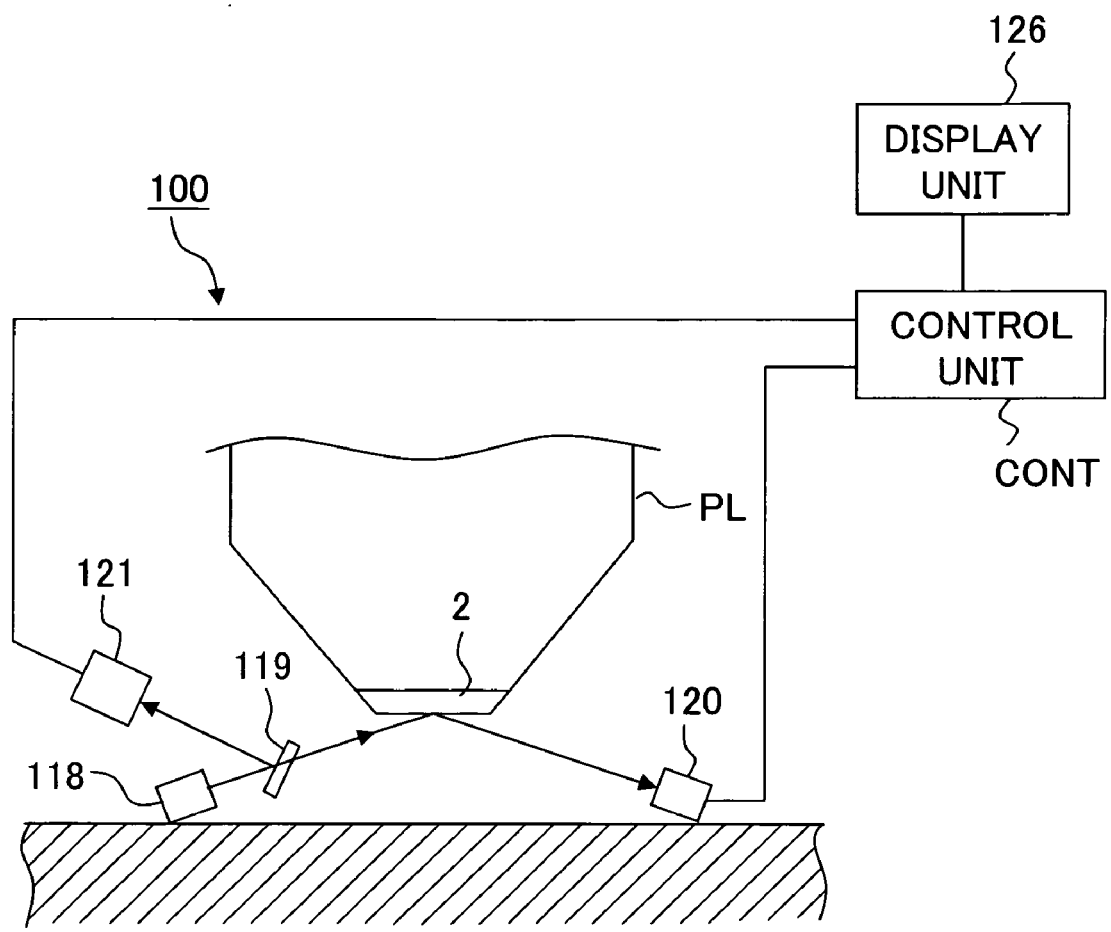
FIG. 15 schematically shows an example of a foreign matter-detecting system.

It is preferable to confirm whether or not any foreign matter is adhered to the optical element 2 disposed at the end portion of the projection optical system PL by using a foreign matter-detecting system after the washing operation and the liquid removal operation. FIG. 15 schematically shows an example of the foreign matter-detecting system 100. The foreign matter referred to herein includes the remaining liquid (liquid droplet) 1, for example, as well as the broken pieces of the photoresist and the deposits of the electrolyte contained in the photoresist as described above.

With reference to FIG. 15, the foreign matter-detecting system 100 includes a light-emitting section 118 which is provided on the substrate stage PST (Z stage 52) and which radiates a predetermined radiation light beam from an obliquely downward position onto the surface of the optical element 2 disposed at the end portion of the projection optical system PL, a branching mirror 119 which is arranged on the optical path for connecting the surface of the optical element 2 and the light-emitting section 118, a first light-receiving section 120 which is provided on the substrate stage PST and which receives the reflected light beam from the surface of the optical element 2 on the basis of the radiation from the light-emitting section 118, and a second light-receiving section 121 which is arranged at a position over the substrate stage PST and which receives the branched light beam from the branching mirror 119 on the basis of the radiation from the light-emitting section 118. In this embodiment, for example, the light-emitting section 118 and the first light-receiving section 120, which constitute the foreign matter-detecting system 100, are provided at the positions other than those of the substrate holder and the washing station on the substrate stage PST. The light-receiving results obtained by the first and second light-receiving sections 120, 121 are outputted as photoelectric signals to the control unit CONT which constitutes a part of the foreign matter-detecting system 100. The control unit CONT is constructed to calculate, as the real reflectance, the light reflectance of the surface of the optical element 2 on the basis of the photoelectric signals outputted from the first and second light-receiving sections 120, 121 so that the degree of contamination of the surface of the optical element 2 is measured on the basis of the result of comparison between the calculated real reflectance and the previously stored predetermined reflectance. In other words, if any foreign matter adheres to the optical element 2, then any scattered light is generated due to the foreign matter to change the reflectance, and the receiving amount of light received by the first light-receiving section 120 is changed. The control unit CONT previously stores, as the predetermined reflectance, the light reflectance of the surface of the optical element 2 measured upon the completion of the production of this apparatus in which it is assumed that the surface of the optical element 2 is not contaminated to such an extent that the optical characteristics are affected.

As explained with reference to FIGS. 13 and 14, the control unit CONT moves the substrate stage PST to arrange the foreign matter-detecting system 100 under the projection optical system PL after completing the washing process for the optical element 2 disposed at the end portion of the projection optical system PL. When the predetermined radiation light beam is radiated from the light-emitting section 118, then the radiation light beam, which is transmitted through the branching mirror 119, is radiated onto the surface of the optical element 2, and the radiation light beam is reflected by the surface. The reflected light beam is received by the first light-receiving section 120. On the other hand, the radiation light beam (branched light beam), which is branched by the branching mirror 119, does not arrive at the surface of the optical element 2, and the radiation light beam is received by the second light-receiving section 121. The photoelectric signals, each of which is subjected to the photoelectric conversion by one of the light-receiving sections 120, 121, are outputted to the control unit CONT respectively. The control unit CONT calculates the reflectance of the surface of the optical element 2 on the basis of the photoelectric signal supplied from the first light-receiving section 120 and the photoelectric signal supplied from the second light-receiving section 121. That is, in general, when the light beam comes, at a certain angle of incidence, into the boundary surface between two media, the reflectance R is represented by $R=Ir/I_0$ provided that $I_0$ represents the intensity of the energy of the incoming light flux, and Ir represents the intensity of the energy of the reflecting light flux. Therefore, the control unit CONT determines the real reflectance Rr assuming that the intensity of the energy based on the photoelectric signal from the first light-receiving section 120 is Ir, and the intensity of the energy based on the photoelectric signal from the second light-receiving section 121 is $I_0$. Subsequently, the control unit CONT reads the predetermined reflectance $R_0$ which is previously stored in order to calculate the difference $\Delta R$ ($=R_0-Rr$) between the predetermined reflectance $R_0$ and the real reflectance Rr. The display signal, which is based on the determined difference $\Delta R$ between the both reflectances $R_0$ and Rr, is outputted to the display unit 126. The display unit 126 numerically displays the degree of contamination of the surface of the optical element 2 on the basis of the display signal. If the degree of contamination exceeds a predetermined allowable value, then the control unit CONT judges that the foreign matter is present in an amount of not less than an allowable amount on the surface of the optical element 2, and the control unit CONT controls the washing unit so that the washing process is performed again.

This embodiment is constructed such that the radiation light beam is radiated onto the optical element 2, and the scattered light on the surface of the optical element 2 is detected. However, when any foreign matter adheres to the optical element 2, the uneven illuminance or the telecentric deviation is observed on the side of the image plane of the projection optical system PL. Therefore, it is possible to detect whether or not any foreign matter adheres by measuring the illuminance at the focus plane and the defocus plane respectively by using an illuminance sensor provided on the substrate stage PST.

In the embodiment shown in FIG. 15, the liquid and the foreign matter (impurity) adhered to the surface of the optical element 2 are detected by radiating the light beam onto the optical element 2 and receiving the scattered light therefrom. However, the detecting method is not limited thereto. For example, the detection may be performed by using the mask alignment system 6 described above. Further, the foreign matter-detecting system may be used to confirm whether or not any foreign matter adheres to the optical element 2 disposed at the end portion of the projection optical system PL not only after the washing of the surface of the optical element 2 but also at a predetermined timing during the exchange of the substrate P or the like. When any foreign matter is detected, the washing operation may be performed. The foreign matter-detecting system 100 detects the foreign matter on the optical element 2 disposed at the end portion of the projection optical system PL. However, it is also allowable to detect the foreign matter on the surface of any other part to make contact with the liquid on the side of the image plane of the projection optical system PL.

Figure 16:
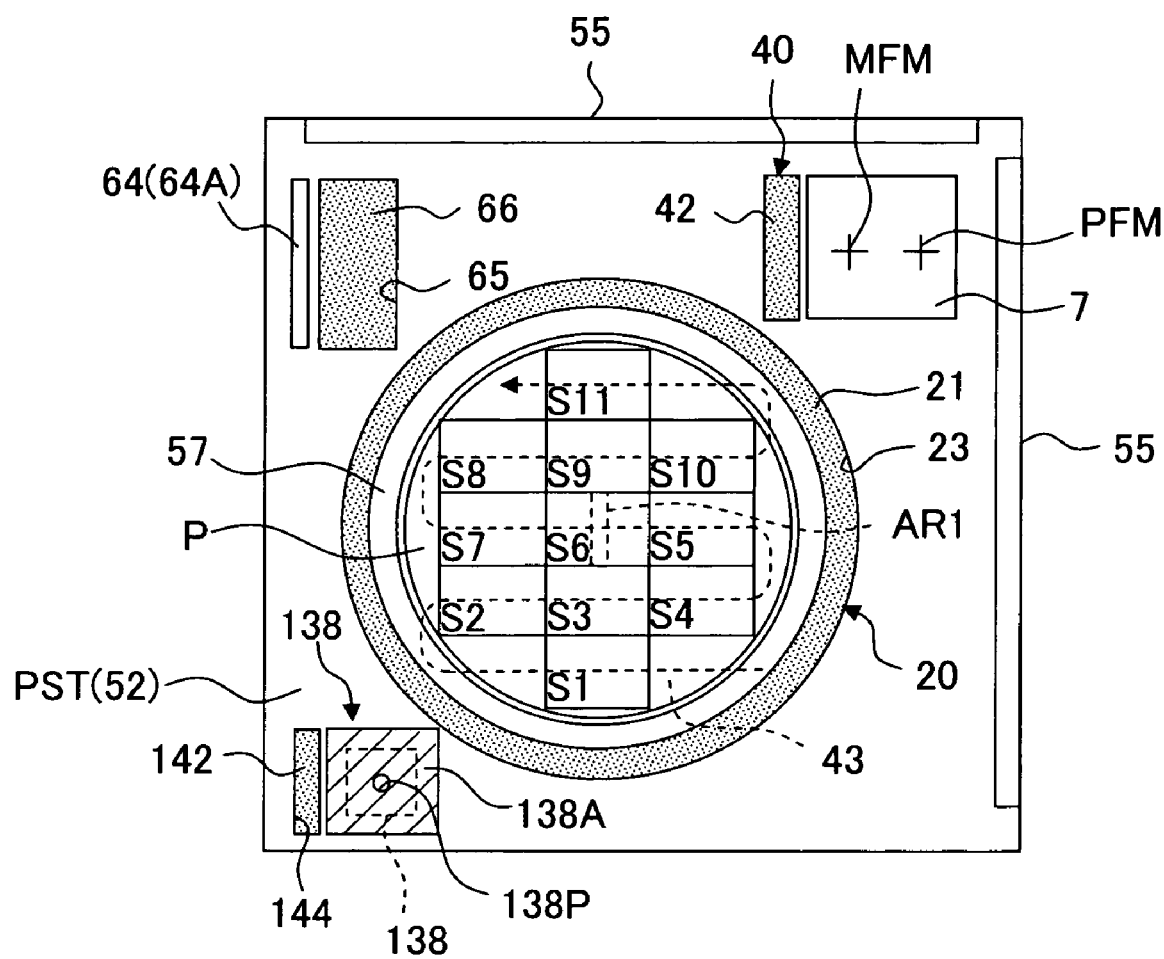
FIG. 16 shows a plan view illustrating another embodiment of a substrate stage.

Another Embodiment of Exposure Apparatus Based on Use of First Liquid-Removing Unit FIG. 16 shows another embodiment of the exposure apparatus provided with the first liquid-removing unit. In this embodiment, the Z stage 52 is provided with a plate member (upper plate) 138A which constitutes a part of an uneven illuminance sensor (measuring system) 138 for receiving the light beam radiated onto the side of the image plane (side of the substrate P) via the projection optical system PL, and a liquid-absorbing member 142, which recovers the liquid removed from the plate member 138A, is further provided in the vicinity thereof. The liquid-absorbing member 142 is arranged in a groove 144 formed in the Z stage 52. The plate member 138A is formed such that the surface of the glass plate is subjected to the patterning with a thin film including a light-shielding material such as chromium, and a pinhole 138P is provided at a central portion thereof. The upper surface of the plate member 138A has the liquid repellence. In this embodiment, the surface of the plate member 138A is coated with a material having the liquid repellence such as a fluorine-based compound.

Figure 17:
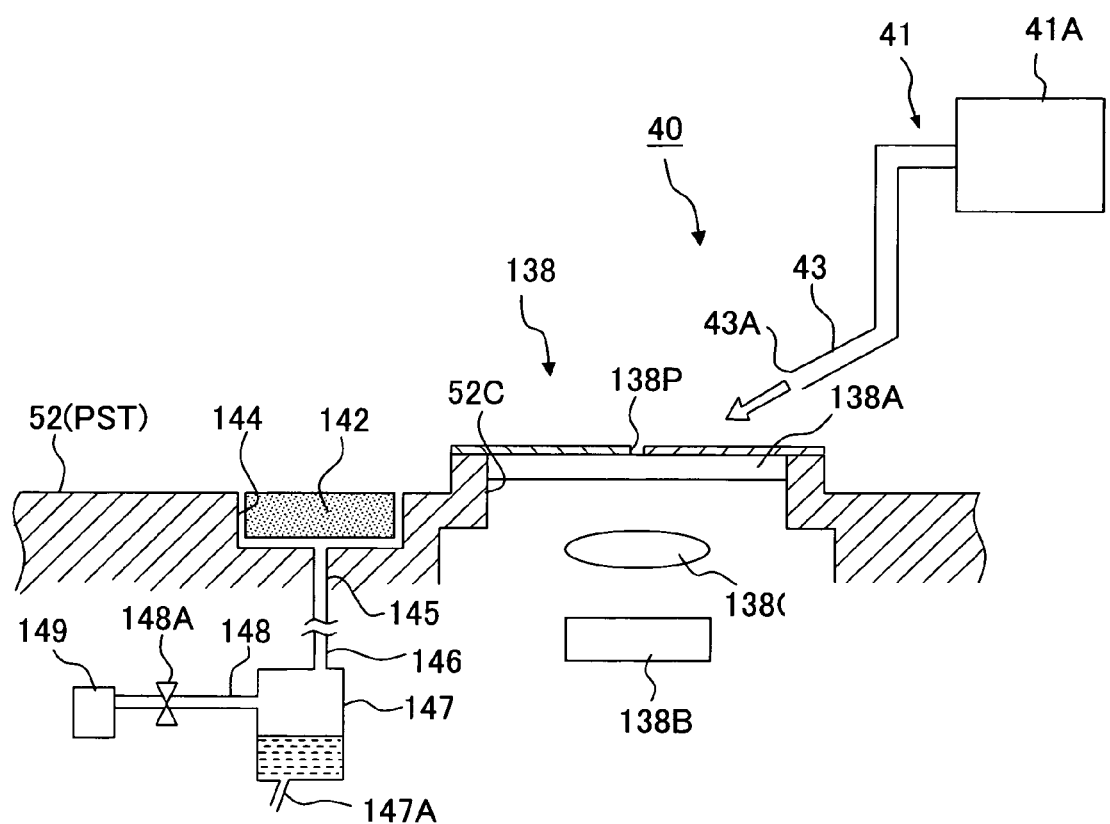
FIG. 17 schematically shows an example of a first liquid-removing unit.

FIG. 17 shows a situation in which the adhered liquid is removed from the plate member 138A which is provided on the substrate stage PST and which constitutes a part of the uneven illuminance sensor 138. In this embodiment, the uneven illuminance sensor 138 measures, at a plurality of positions, the illuminance (intensity) of the exposure light beam radiated onto the side of the image plane by the aid of the projection optical system PL to measure the uneven illuminance (illuminance distribution) of the exposure light beam radiated onto the side of the image plane of the projection optical system PL, as disclosed in Japanese Patent Application Laid-open No. 57-117238 (corresponding to U.S. Pat. No. 4,465,368). The uneven illuminance sensor 138 includes the plate member 138A which is provided on the substrate stage PST (Z stage 52), which has the light-shielding film subjected to the patterning on the surface of the glass plate, and which has the pinhole 138P formed at the central portion thereof, an optical system 138C which is embedded in the Z stage 52 and which is illuminated with the light beam passed through the pinhole 138P, and a light-receiving element (light-receiving system) 138B which receives the light beam passed through the optical system 138C. For example, a relay optical system may be provided between the optical system 138C and the light-receiving element 138B, and the light-receiving element 138B may be arranged outside the Z stage 52 as well. The disclosure of U.S. Pat. No. 4,465,368 is incorporated herein by reference within a range of permission of the domestic laws and ordinances of the designated state or the selected state designated or selected in this international application.

When the illuminance distribution is measured by using the uneven illuminance sensor 138, the space between the projection optical system PL and the plate member 138A is filled with the liquid in a state in which the projection optical system PL is opposed to the plate member 138A of the uneven illuminance sensor 138. Subsequently, the pinhole 138P is successively moved to a plurality of positions in the radiation area onto which the exposure light beam is radiated to determine (measure) the illuminance distribution (uneven illuminance) by measuring the illuminance of the exposure light beam at the respective positions as described above. After the illuminance distribution is determined, the control unit CONT moves the substrate stage PST to arrange the plate member 138A of the uneven illuminance sensor 138 under the nozzle section 43 of the first liquid-removing unit 40.

As described above, the liquid-absorbing member 142, which recovers the liquid removed from the plate member 138A by the first liquid-removing unit 40, is provided at the position adjacent to the plate member 138A on the Z stage 52. The liquid-absorbing member 142 is formed of, for example, a porous material such as a porous ceramics and a sponge in the same manner as the liquid-absorbing member 42 described above, which is capable of retaining a predetermined amount of the liquid.

The control unit CONT blows the gas against the plate member 138A from the nozzle section 43 of the first liquid-removing unit 40, and thus the liquid adhered to the plate member 138A is blown off and removed. The blown off liquid is retained (recovered) by the liquid-absorbing member 142 arranged at the position opposed to the blow port 43A of the nozzle section 43 of the first liquid-removing unit 40. The liquid-repelling treatment is applied to the surface of the plate member 138A. Therefore, it is possible to avoid any invasion of the liquid into the pinhole 138P. Additionally, it is possible to satisfactorily remove the liquid from the plate member 138A by allowing the gas to blow thereagainst.

A flow passage 145, which is communicated with the groove 144, is formed in the Z stage 52. The liquid-absorbing member 142 is arranged in the groove 144 so that the bottom thereof makes contact with the flow passage 145. The flow passage 145 is connected to one end of a tube passage 146 which is provided outside the Z stage 52. On the other hand, the other end of the tube passage 146 is connected to a pump 149 via a tube passage 148 having a valve 148A and a tank 147 provided outside the Z stage 52. The control unit CONT drives the gas supply section 41A of the first liquid-removing unit 40, and the control unit CONT drives the pump 149. Accordingly, the liquid, which is recovered by the liquid-absorbing member 142, is sucked and collected in the tank 147. The tank 147 is provided with a discharge flow passage 147A. When a predetermined amount of the liquid 1 is pooled in the tank 147, the liquid 1 is discharged to the outside from the tank 147 via the discharge flow passage 147A.

For example, the suction of the liquid and the blowing of the dry air may be used, or they may be appropriately combined and used, as explained in the foregoing embodiment in relation to the method for removing the liquid from the plate member 138A by the first liquid-removing unit 40. It is unnecessary that the entire surface of the plate member 138A is liquid-repellent. It is also allowable that only a part of the plate member 138A, for example, only the surrounding of the pinhole 138P may be liquid-repellent. Not only the upper surface of the plate member 138A of the uneven illuminance sensor 138 but also the surface of another part on the substrate stage PST may be liquid-repellent. It is also allowable that the coating of the liquid-repelling material may be omitted when the ability of the first liquid-removing unit 40 to remove the liquid is sufficiently high.

Other sensors, which are not limited to the uneven illuminance sensor and which receive the exposure light beam passed via the projection optical system PL and the liquid through the light-transmitting portion, are also arranged on the substrate stage PST, including, for example, a radiation amount monitor as disclosed in Japanese Patent Application Laid-open No. 11-16816 (corresponding to United States Patent Application Publication No. 2002/0061469) and a spatial image-measuring sensor for measuring, for example, the image characteristics as disclosed in Japanese Patent Application Laid-open No. 2002-14005 (corresponding to United States Patent Application Publication No. 2002/0041377). The sensors as described above also have such a possibility that the liquid may remain on and adhere to the surface of the flat portion formed with the light-transmitting portion. Therefore, it is also allowable to apply, to the sensors, the method for removing the liquid based on the use of the first liquid-removing unit 40 as described above. When a reflecting member is arranged on the substrate stage PST as disclosed in Japanese Patent Application Laid-open No. 62-183522 (corresponding to U.S. Pat. No. 4,780,747), it is also allowable to remove the liquid remaining on and adhered to the surface thereof by using the first liquid-removing mechanism 40. The contents of United States Patent Application Publication No. 2002/0061469, United States Patent Application Publication No. 2002/0041377, and U.S. Pat. No. 4,780,747 are incorporated herein by reference within a range of permission of the domestic laws and ordinances of the designated state or the selected state designated or selected in this international application.

When a sensor, which is detachable with respect to the substrate stage PST, is used as disclosed in Japanese Patent Application Laid-open Nos. 11-238680 and 2000-97616 and International Publication WO 02/063664 (corresponding to United States Patent Application Publication No. 2004/0090606), the sensor may be detached from the substrate stage PST after removing the liquid remaining on and adhered to the surface of the sensor by using the first liquid-removing unit 40. The disclosure of United States Patent Publication No. 2004/0090606 is incorporated herein by reference within a range of permission of the domestic laws and ordinances of the designated state or the selected state designated or selected in this application.

Embodiment of Exposure Apparatus Based on Use of Third Liquid-Removing Unit

Figure 18:
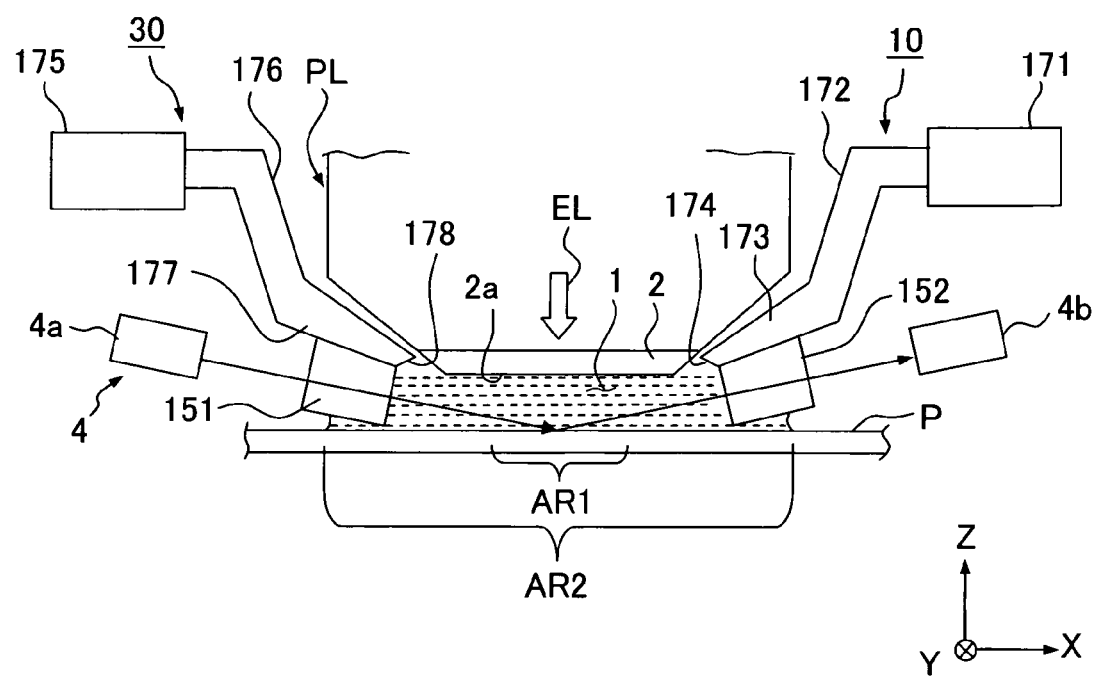
FIG. 18 schematically shows another embodiment of an exposure apparatus of the present invention.

FIG. 18 schematically shows an exposure apparatus based on the use of a third liquid-removing unit. With reference to FIG. 18, a focus-detecting system 4 includes a light-emitting section 4a and a light-receiving section 4b. In this embodiment, those provided in the vicinity of the end portion of the projection optical system PL are a first optical member 151 through which a detecting light beam is transmissive, the detecting light beam being radiated from the light-emitting section 4a of the focus-detecting system 4, and a second optical member 152 through which the detecting light beam reflected on the substrate P is transmissive. The first optical member 151 and the second optical member 152 are supported in a state of being separated from the optical element 2 disposed at the end portion of the projection optical system PL. The first optical member 151 is arranged on the −X side of the optical element 2, and the second optical member 152 is arranged on the +X side of the optical element 2. The first and second optical members 151, 152 are provided at the positions at which they are capable of making contact with the liquid 1 in the liquid immersion area AR2 and at which the optical path for the exposure light beam EL and the movement of the substrate P are not inhibited.

As shown in FIG. 18, for example, during the exposure process for the substrate P, the liquid 1 is supplied and recovered by the liquid supply mechanism 10 and the liquid recovery mechanism 30 so that all of the optical path of the exposure light beam EL passed through the projection optical system PL, i.e., all of the optical path of the exposure light beam EL between the optical element 2 and the substrate P (projection area AR1 on the substrate P) is filled with the liquid 1. Further, when all of the optical path of the exposure light beam EL between the optical element 2 and the substrate P is filled with the liquid 1, and the liquid immersion area AR2 is formed in a desired state on the substrate P to cover all of the projection area AR1, then the liquid 1, which forms the liquid immersion area AR2, makes tight contact (contact) with the end surfaces of the first optical member 151 and the second optical member 152 respectively. In the state in which the liquid immersion area AR2 is formed on the substrate P and the liquid 1 makes tight contact with the end surfaces of the first optical member 151 and the second optical member 152 respectively, all of the optical path between the first optical member 151 and the second optical member 152, which is included in the optical path for the detecting light beam radiated from the light-emitting section 4a of the focus-detecting system 4 and the reflected light beam thereof from the surface of the substrate P, is filled with the liquid 1. The setting is made such that the detecting light beam, which is radiated from the light-emitting section 4a of the focus-detecting system 4, is radiated onto the projection area AR1 of the projection optical system PL on the substrate P in the state in which all of the optical path for the detecting light beam is filled with the liquid 1.

The liquid contact surfaces, which are the end surfaces of the first and second optical members 151, 152, are subjected to, for example, the liquid-attracting treatment to have the lyophilicity or liquid-attracting property. Accordingly, the liquid 1 in the liquid immersion area AR2 tends to easily make tight contact with the liquid contact surfaces of the first and second optical members 151, 152. Therefore, it is easy to maintain the shape of the liquid immersion area AR2.

In FIG. 18, the liquid supply mechanism 10 and the liquid recovery mechanism 30 are simplified and illustrated in the drawing. The liquid supply mechanism 10 shown in FIG. 18 includes a liquid supply section 171 which is capable of feeding the liquid 1, and a supply tube 172 which connects a supply nozzle 173 and the liquid supply section 171. The liquid 1, which is fed from the liquid supply section 171, passes through the supply tube 172, and then the liquid 1 is supplied onto the substrate P from a liquid supply port 174 of the supply nozzle 173. The liquid recovery mechanism 30 shown in FIG. 18 includes a liquid recovery section 175 which is capable of recovering the liquid 1, and a recovery tube 176 which connects a recovery nozzle 177 and the liquid recovery section 175. The liquid 1 on the substrate P is recovered from a recovery port 178 of the recovery nozzle 177, and then the liquid 1 is recovered to the liquid recovery section 175 through the recovery tube 176.

This embodiment has been explained assuming that the first optical member 151 and the second optical member 152 are mutually independent members. However, for example, an annular optical member may be arranged to surround the optical element 2 disposed at the end portion of the projection optical system PL. The detecting light beam may be radiated onto a part of the annular optical member. The detecting light beam, which has passed through the liquid immersion area AR2 and along the surface of the substrate P, may be received via a part of the annular optical member. When the optical member is provided in the annular form, and the liquid 1 in the liquid immersion area AR2 is allowed to make tight contact with the inner side surface of the annular optical member, then it is possible to satisfactorily maintain the shape of the liquid immersion area AR2. In this embodiment, the first optical member 151 and the second optical member 152 are separated from each other with respect to the projection optical system PL. However, it is also allowable to integrally provide the first optical member 151, the second optical member 152, and the optical element 2 of the projection optical system PL.

After performing the liquid immersion exposure process in the state shown in FIG. 18, the control unit CONT arranges the washing plate (or a dummy substrate) under the projection optical system PL, for example, as explained with reference to FIG. 13. The liquid supply mechanism 10 and the liquid recovery mechanism 30 are used to form the liquid immersion area AR2 on the washing plate. The liquid 1 in the liquid immersion area AR2 is used to wash the optical element 2 disposed at the end portion of the projection optical system PL, the first and second optical members 151, 152, those disposed in the vicinity of the supply port 174 of the supply nozzle 173, and those disposed in the vicinity of the recovery port 178 of the recovery nozzle 177. After completing the washing, the control unit CONT uses, for example, the liquid recovery mechanism 30 to recover the liquid 1 of the liquid immersion area AR2.

Figure 19:
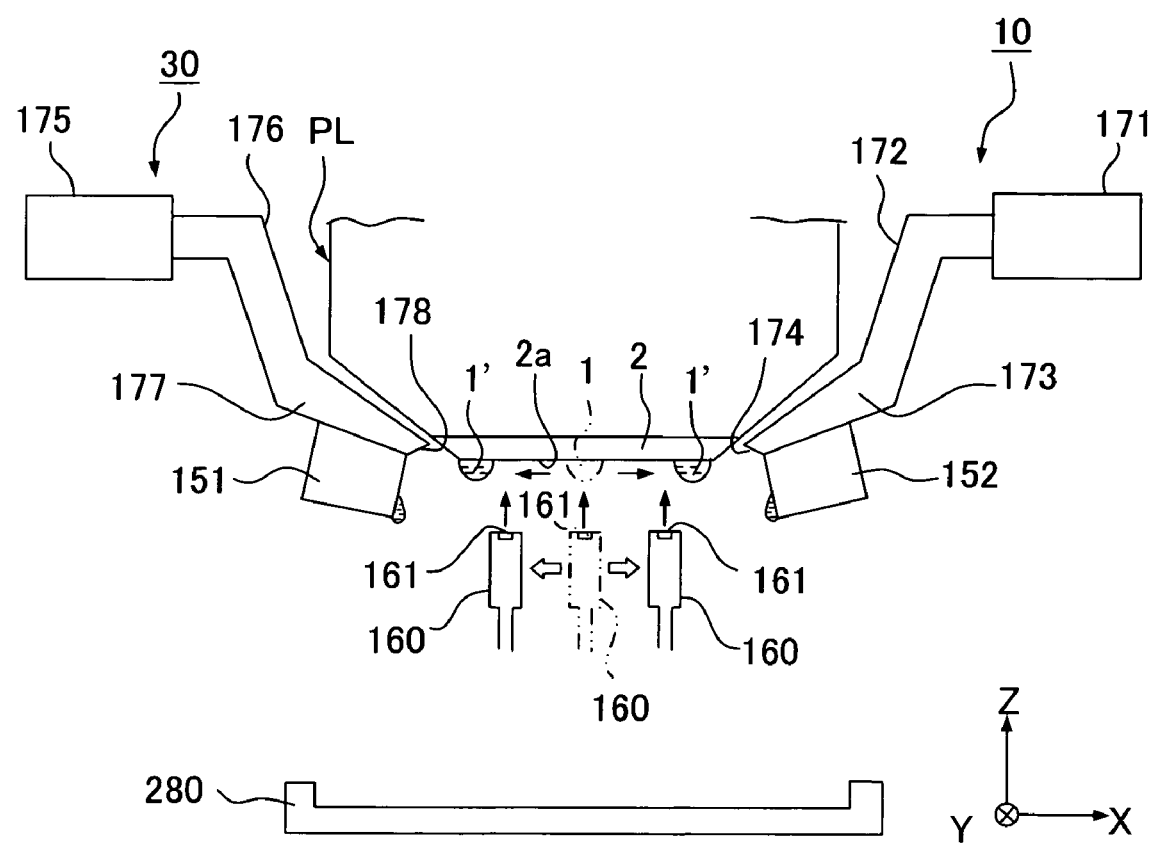
FIG. 19 schematically shows another embodiment of the operation for removing the liquid according to the present invention.

After recovering the liquid 1 of the liquid immersion area AR2, the control unit CONT arranges a gas nozzle 160 (third liquid-removing unit) for blowing the gas, under the projection optical system PL as shown in FIG. 19 by the aid of an unillustrated driving unit. In this situation, the substrate stage PST is moved to the load/unload position (see FIG. 9) in order to unload the substrate P. A liquid-receiving member 280, which receives the liquid 1 fallen, for example, from the optical element 2, is arranged under the projection optical system PL. In a situation in which the gas nozzle 160 is not used, the gas nozzle 160 is arranged at a predetermined position in the exposure apparatus (EX) to make no interference with the substrate stage PST. The gas nozzle 160 may be provided at a position other than the position of the substrate holder on the substrate stage PST.

The control unit CONT blows the gas from a blow port 161 of the gas nozzle 160, and the blown liquid is used to move the position of the liquid 1 adhered to the optical element 2, the first and second optical members 151, 152, the supply nozzle 173, and/or the recovery nozzle 177. For example, as shown in FIG. 19, the control unit CONT firstly moves the blow port 161 of the gas nozzle 160 in parallel to the substrate surface (in the X direction) to arrive at the position opposed to the area of the lower surface 2a of the optical element 2 through which the exposure light beam EL passes. After that, the gas is blown from the blow port 161. The gas nozzle 160 is moved toward the outside of the area through which the exposure light beam EL passes, in a state in which the gas is being blown. Accordingly, it is possible to move, to the outside of the area, the liquid (liquid droplet) 1 adhered to the area of the lower surface 2a of the optical element 2 through which the exposure light beam EL passes, i.e., the area of the lower surface 2a of the optical element 2 corresponding to the projection area AR1. In this embodiment, the area, through which the exposure light beam EL passes, is a substantially central portion of the lower surface 2a of the optical element 2. Therefore, the method as described above can be used to move, toward the end of the lower surface 2a, the liquid 1 adhered to (remaining on) the central portion of the lower surface 2a (see reference numeral 1' shown in FIG. 19). In other words, the control unit CONT removes the liquid adhered to the area through which the exposure light beam EL passes, by moving the liquid to the outside of the area by using the blowing gas without drying the liquid 1 adhered to the area through which the exposure light beam EL passes. Accordingly, it is possible to avoid the inconvenience which would be otherwise caused such that the water mark is formed in at least the area of the lower surface 2a of the optical element 2 through which the exposure light beam EL passes. In this embodiment, the gas nozzle 160 and the unit equipped therewith function as the third liquid-removing unit.

In this embodiment, the liquid is moved aside (removed) from the area through which the exposure light beam EL passes. However, there is no limitation thereto. It is appropriate to move aside the liquid from a desired area, if necessary.

Figure 20A:
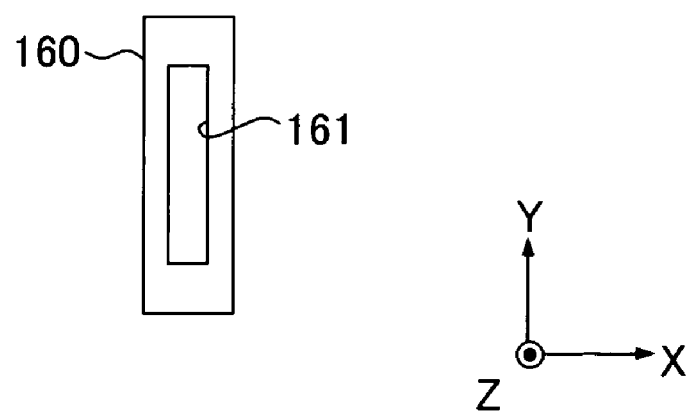
FIGS. 20A and 20B show the relationship between the gas nozzle and the optical element.
Figure 20B:
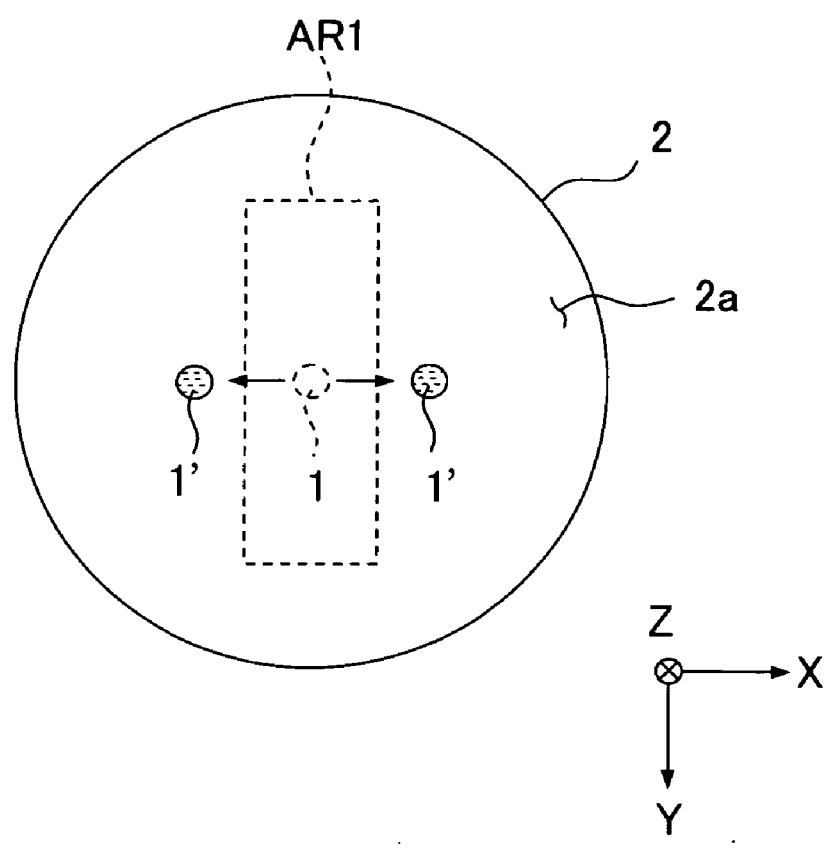

FIG. 20A shows an example of the blow port 161. As shown in FIG. 20A, the blow port 161 is formed to be slit-shaped in which the Y axis direction is the longitudinal direction in this embodiment. FIG. 20B shows the lower surface 2a of the optical element 2. The projection area AR1 is slit-shaped (rectangular) in which the Y axis direction is the longitudinal direction. The blow port 161 is formed to have a size smaller than the lower surface 2a of the optical element 2. When the liquid 1, which is adhered to the central portion of the lower surface 2a of the optical element 2, is moved aside as described above, the control unit CONT firstly allows the gas to blow from the blow port 161 in a state in which the blow port 161 of the gas nozzle 160 is opposed to the substantially central portion of the lower surface 2a of the optical element 2. The gas nozzle 160 is moved toward the +X side (or the −X side) while maintaining the gas blowing state. In other words, the control unit CONT moves the gas nozzle 160 in the X axis direction. Accordingly, the control unit CONT can smoothly move (move aside) the liquid 1 to the outside of the area of the lower surface 2a of the optical element 2 corresponding to the projection area AR1. When the liquid 1, which is adhered to the central portion of the lower surface 2a of the optical element 2 (central portion of the area corresponding to the projection area AR1), is moved in the Y axis direction in order to exclude the liquid 1 to the outside of the area corresponding to the projection area AR1, the movement distance is long, because the Y axis direction is the longitudinal direction for the projection area AR1. When the movement distance is long, the movement time is long as well. Therefore, when much weight is given to the time efficiency, it is desirable that the liquid 1, which is adhered to the central portion of the lower surface 2a of the optical element 2 (central portion of the area corresponding to the projection area AR1), is moved in the X axis direction. Accordingly, the liquid 1 can be moved smoothly to the outside of the area corresponding to the projection area AR1.

In this embodiment, the gas, which is blown from the blow port 161 of the gas nozzle 160, is the clean gas obtained after passing through a filter unit (not shown) including a chemical filter and a particle-removing filter. Accordingly, the optical element 2 or the like can be prevented from being contaminated. As for the gas, it is preferable to use a gas which is substantially the same as the gas contained in the environment in which the exposure apparatus EX is installed, specifically a gas which is substantially the same as the gas contained in the chamber in which the exposure apparatus EX is accommodated. In this embodiment, the air (dry air) is used. Alternatively, the nitrogen gas (dry nitrogen) may be used as the gas which is to be blown. If any gas, which is different from the gas contained in the environment in which the exposure apparatus EX is installed, is used, there is such a possibility that any inconvenience such as any measurement error or the like may be caused, for example, due to the variation or fluctuation of the optical path for the measuring light beam of the interferometer which measures the stage position on account of the difference in refractive index between the mutually different gases. However, when the gas, which is blown from the blow port 161, is substantially the same gas as the gas contained in the installation environment for the exposure apparatus EX, it is possible to avoid the inconvenience as described above.

The liquid 1, which has been moved (moved aside) to the outside of the area through which the exposure light beam EL passes, is vaporized (dried) and removed, for example, by a predetermined drying unit and/or the gas blown from the gas nozzle 160.

Even when the liquid, which has been moved to the outside of the area through which the exposure light beam EL passes, is dried, it is possible to suppress the adhesion of any impurity or the like to the portion at which the liquid has been dried at the outside of the area through which the exposure light beam EL passes, because the washing operation has been performed for the lower surface 2a of the optical element 2 before allowing the gas to blow from the gas nozzle 160.

In this embodiment, the liquid, which has been moved to the outside of the area through which the exposure light beam EL passes, may be sucked (recovered).

Similarly, the control unit CONT moves (move aside) the liquid (liquid droplet) adhered to at least the area of each of the end surfaces of the first and second optical members 151, 152 on the liquid contact surface side through which the detecting light beam of the focus-detecting system 4 passes, by using the gas blown from the gas nozzle 160. Accordingly, it is possible to avoid the inconvenience which would be otherwise caused such that the water mark is formed in (any impurity adheres to) at least the area of each of the end surfaces of the first and second optical members 151, 152 through which the detecting light beam passes.

Similarly, the control unit CONT moves aside the liquid 1 adhered to (remaining on) the supply nozzle 173 and the recovery nozzle 177 by using the gas blown from the gas nozzle 160. Accordingly, it is possible to avoid the inconvenience of the formation of the water mark on the supply nozzle 173 and the recovery nozzle 177. The water mark acts as the foreign matter (impurity). Therefore, if the water mark is formed, for example, on the supply nozzle 173 (supply port 174) and/or the recovery nozzle 177 (recovery port 178), there is such a possibility that the foreign matter (impurity), which results from the water mark, may invade the liquid immersion area AR2 when the liquid immersion area AR2 is formed. In such a situation, the exposure accuracy and/or the measuring accuracy is consequently deteriorated. Further, it is considered that the recovery ability of the liquid recovery mechanism 30 is changed depending on the contact angle (affinity) of the recovery nozzle 177 (recovery port 178) with respect to the liquid 1. If the water mark is formed on the recovery nozzle 177, and the contact angle with respect to the liquid 1 is changed, then there is such a possibility that the recovery ability of the liquid recovery mechanism 30 may be deteriorated. However, the inconvenience as described above can be avoided by removing the liquid 1 adhered to the nozzles 173, 177 as described in this embodiment.

As explained above, the liquid, which adheres to the predetermined area of the optical element 2 and the first and second optical members 151, 152 (area irradiated with the exposure light beam and/or the detecting light beam), is moved (moved aside) to the outside of the predetermined area by blowing the gas thereagainst while moving the gas nozzle 160 (blow port 161) relative to the predetermined area. Accordingly, it is possible to avoid the inconvenience of the formation of the water mark in the predetermined area.

This embodiment is constructed such that the gas is firstly blown against the central portion of the lower surface 2a, and then the gas nozzle 160 is moved substantially linearly toward the end of the lower surface 2a in the state in which the blow of the gas is maintained, when the liquid 1 adhered to the lower surface 2a of the optical element 2 is moved aside to the end. However, the gas nozzle 160 may be moved so that the blow port 161 depicts a spiral locus with respect to the lower surface 2a. The shape of the blow port 161 is not limited to the slit-shaped form. It is also allowable to use any arbitrary shape including, for example, circular shapes. Further, a porous member may be arranged at the blow port 161.

In this embodiment, one gas nozzle 160 (blow port 161) is provided. It is a matter of course that a plurality of gas nozzles 160 (blow ports 161) may be provided, and they may be used simultaneously. Further, a plurality of gas nozzles 160 may be used, for example, as follows. That is, the liquid 1 adhered to the optical element 2 is removed by using the gas blown from the first gas nozzle 160, and the liquid 1 adhered to the first optical member 151 or the second optical member 152 is removed by using the gas blown from a second gas nozzle 160. The removing operations as described above may be used concurrently. When the liquid-removing operations are performed concurrently for a plurality of predetermined areas by using a plurality of gas nozzles 160 respectively, it is possible to efficiently perform the liquid-removing operations.

In order to move (move aside) the liquid 1 adhered to the end surfaces of the first and second optical members 151, 152 and the optical element 2, for example, it is also allowable to use, for example, the gas blown from the blow port 64A of the second liquid-removing unit 60 explained with reference to FIG. 8.

Figure 21:
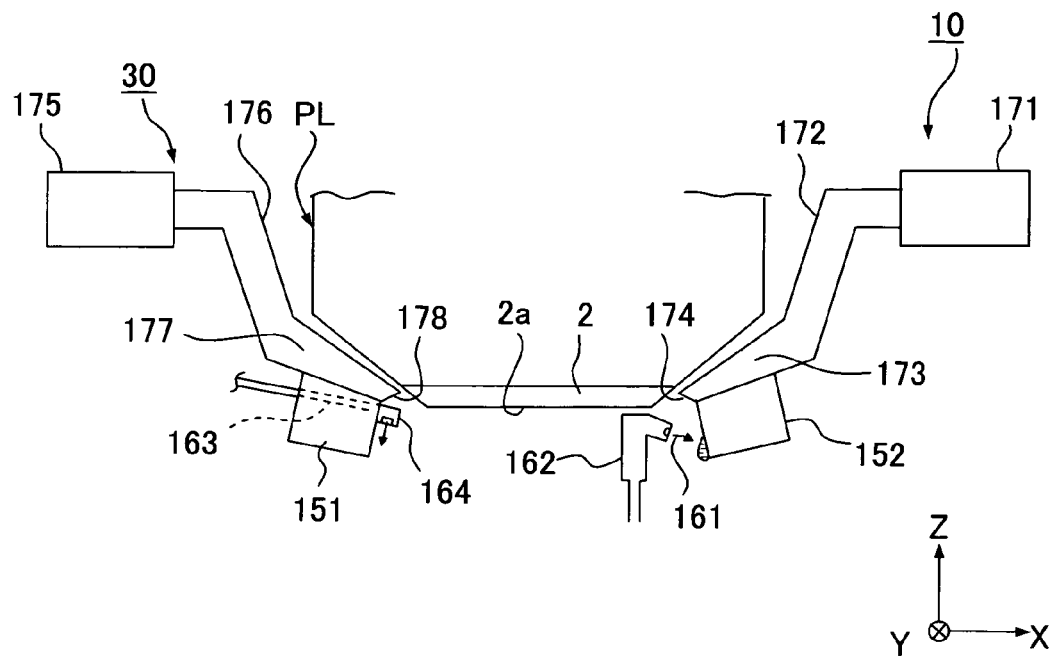
FIG. 21 schematically shows another embodiment of an exposure apparatus of the present invention.

The embodiment described above is constructed such that the gas is blown from the lower position against the optical element 2 and the first and second optical members 151, 152. However, the gas may be blown from an upper position. For example, as shown in FIG. 21, a blow port 161 of the gas nozzle 162 may be installed so that the blow port 161 is directed downwardly or obliquely downwardly to remove (move aside) the liquid 1 adhered to the end surface of the second optical member 152 on the liquid contact surface side. It is a matter of course that the gas nozzle 160 can be also used to remove the liquid 1 adhered to the end surface of the first optical member 151. Alternatively, a flow passage 163 may be formed through a part of the first optical member 151 (or the second optical member 152). A gas nozzle 164, which is connected to the flow passage 163, may be provided on the end surface of the first optical member 151 on the liquid contact surface side. The gas, which passes through the flow passage 163 and the gas nozzle 164, can be also blown against the end surface of the first optical member 151 from an upper position. The flow passage 163 is formed at a position at which the optical path for the detecting light beam of the focus-detecting system 4 is not inhibited.

In the embodiment described above, the liquid is removed by using the gas nozzle 160 after washing the optical element 2 disposed at the end portion of the projection optical system PL, the first and second optical members 151, 152, those disposed in the vicinity of the supply port 174 of the supply nozzle 173, and those disposed in the vicinity of the recovery port 178 of the recovery nozzle 177. However, the washing step may be omitted. The gas nozzle 160 may be provided on the substrate stage PST in the same manner as in the embodiment described above, and the gas nozzle 160 may be moved by moving the substrate stage PST. Alternatively, as disclosed in Japanese Patent Application Laid-open No. 11-135400, a stage, which is movable on the image plane side of the projection optical system PL, may be further provided independently from the substrate stage PST to arrange the gas nozzle 160 on the stage.

In the embodiment described above, the gas is blown from the blow port 161 to move the liquid 1 adhered to the optical element 2, the first and second optical members 151, 152, and/or the nozzles 173, 177. However, it is also possible to move the liquid 1 remaining on (adhered to) the substrate stage PST by using the gas blown from the blow port 161. For example, the blow port 161 may be arranged to be opposed to the upper surface of the substrate stage PST. The gas may be blown from the blow port 161 against the reference member 7 as explained, for example, with reference to FIG. 3. The liquid 1 adhered onto the reference member 7 can be moved (moved aside) to the outside of the reference member 7 (or to the outside of the detection objective area on the reference member 7) without drying the liquid 1. Similarly, the gas can be blown from the blow port 161 to move (move aside), without performing the drying, the liquid 1 adhered onto the upper plate 138A of the uneven illuminance sensor 138 as explained, for example, with reference to FIG. 16, and the liquid 1 adhered to a radiation amount monitor as disclosed, for example, in Japanese Patent Application Laid-open No. 11-16816 and to an upper plate of a spatial image-measuring sensor as disclosed, for example, in Japanese Patent Application Laid-open No. 2002-14005.

Embodiment of Exposure Apparatus Based on Use of Fourth Liquid-Removing Unit

Figure 22:
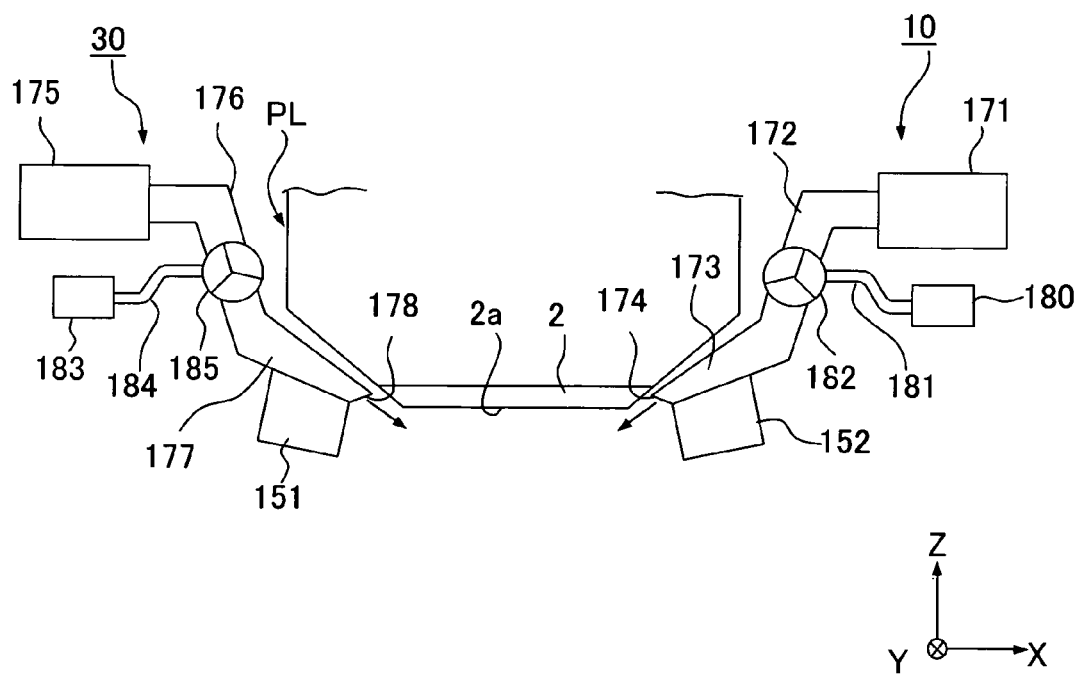
FIG. 22 schematically shows another embodiment of an exposure apparatus of the present invention.

FIG. 22 shows an embodiment of an exposure apparatus provided with a liquid-removing unit (fourth liquid-removing unit) different from the first to third liquid-removing units. With reference to FIG. 22, one end of a gas supply tube 181 is connected to an intermediate portion of a supply tube 172, for example, by the aid of a flow passage-switching unit 182 such as a three-way valve. On the other hand, the other end of the gas supply tube 181 is connected to a gas supply section 180. The flow passage-switching unit 182 closes the flow passage which connects the gas supply section 180 and a supply port 174 when the flow passage, which connects the liquid supply section 171 and the supply port 174, is opened. On the other hand, the flow passage-switching unit 182 opens the flow passage which connects the gas supply section 180 and the supply port 174 when the flow passage, which connects the liquid supply section 171 and the supply port 174, is closed. Similarly, one end of a gas supply tube 184 is connected to an intermediate portion of a recovery tube 176 by the aid of a flow passage-switching unit 185. The other end of the gas supply tube 184 is connected to a gas supply section 183. The flow passage-switching unit 185 closes the flow passage which connects the gas supply section 183 and a recovery port 178 when the flow passage, which connects the liquid recovery section 175 and the recovery port 178, is opened. On the other hand, the flow passage-switching unit 185 opens the flow passage which connects the gas supply section 183 and the recovery port 178 when the flow passage, which connects the liquid recovery section 175 and the recovery port 178, is closed. In this embodiment, for example, the gas supply sections 180, 183, the supply port 174, the recovery port 178, and the flow passage-switching unit 182 function as the fourth liquid-removing unit (liquid-removing mechanism) for removing the remaining liquid.

For example, when the liquid immersion area AR2 is formed on the substrate P, the control unit CONT drives the flow passage-switching units 182, 185 so that the flow passage, which connects the liquid supply section 171 and the supply port 174, is opened, and the flow passage, which connects the liquid recovery section 175 and the recovery port 178, is opened. In this situation, the flow passage for connecting the gas supply section 180 and the supply port 174, and the flow passage for connecting the gas supply section 183 and the recovery port 178 are closed.

After the completion of the liquid immersion exposure for the substrate P, the control unit CONT stops the liquid supply operation performed by the liquid supply mechanism 10. Further, the liquid recovery operation is continued by the liquid recovery mechanism 30 for a predetermined period of time after the stop of the liquid supply operation to recover the liquid 1 with which the liquid immersion area AR2 has been formed. When the liquid supply operation performed by the liquid supply mechanism 10 is stopped, the control unit CONT drives the flow passage-switching unit 182 to close the flow passage for connecting the liquid supply section 171 and the supply port 174 and open the flow passage for connecting the gas supply section 180 and the supply port 174. After the liquid 1 of the liquid immersion area AR2 substantially disappears, the control unit CONT drives the gas supply section 180 to start the supply of the gas. The gas, which is supplied from the gas supply section 180, is blown from the supply port 174 of the supply nozzle 174 through the gas supply tube 181 and the flow passage-switching unit 182. Accordingly, the liquid 1, which remains in the flow passage between the flow passage-switching unit 182 and the supply port 174, is successfully blown to the outside via the supply port 174 so that the liquid 1 can be removed. The gas, which is supplied from the gas supply section 180 and which is blown from the supply port 174, can be used to remove, for example, the liquid 1 adhered to the end surfaces of the first and second optical members 151, 152 and the liquid 1 adhered onto the substrate stage PST (including, for example, the measuring member).

Similarly, the control unit CONT drives the flow passage-switching unit 185 after the completion of the recovery operation for the liquid 1 in the liquid immersion area AR2 by the liquid recovery mechanism 30 to close the flow passage for connecting the liquid recovery section 175 and the recovery port 178 and open the flow passage for connecting the gas supply section 183 and the recovery port 178. The control unit CONT uses the gas supplied from the gas supply section 183 so that the liquid 1, which remains in the flow passage between the flow passage-switching unit 185 and the recovery port 178, is blown off to the outside and removed through the recovery port 178. The gas, which is blown from the recovery port 178, can be also used to remove (move aside) the liquid 1 adhered to the end surfaces of the first and second optical members 151, 152 and the liquid 1 adhered onto the substrate stage PST (including, for example, the measuring member).

As explained above, the clean gas is supplied from the gas supply sections 180, 183 when the liquid 1 is neither supplied nor recovered. Accordingly, it is possible to avoid the inconvenience of the formation of the water mark in the internal flow passages of the supply tube 172 and the supply nozzle 173, those disposed in the vicinity of the supply port 174, the internal flow passages of the recovery tube 176 and the recovery nozzle 177, and those in the vicinity of the recovery port 178. In this embodiment, the supply port (discharge port) is commonly used for the liquid and the gas for removing the liquid. Therefore, the structure can be simplified in the vicinity of the liquid supply port, and it is possible to obtain the compact exposure apparatus.

Figure 23:
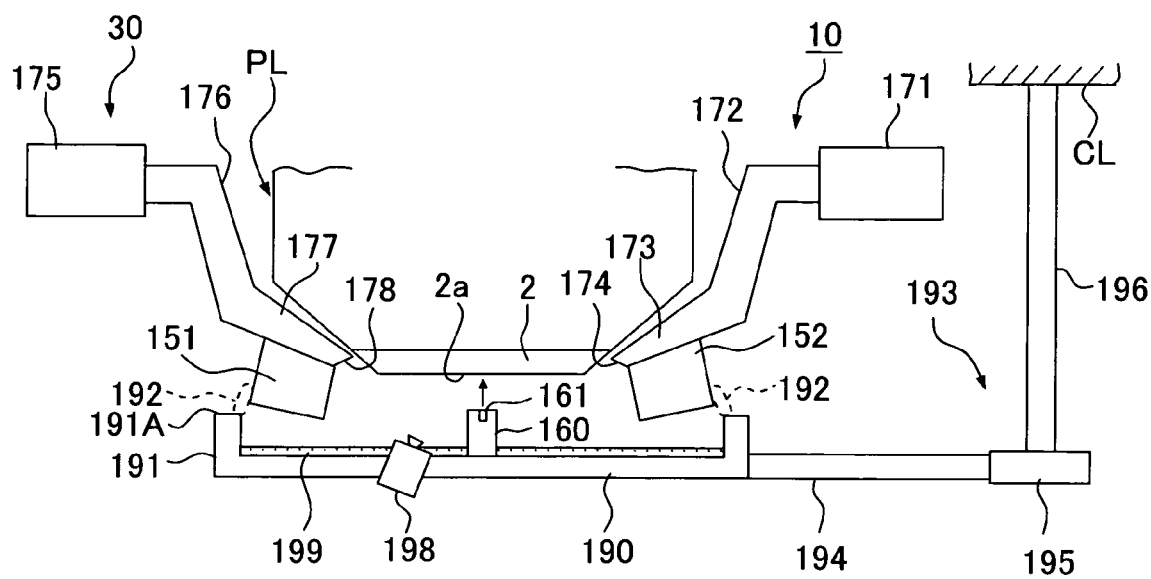
FIG. 23 schematically shows another embodiment of an exposure apparatus of the present invention.

Another Embodiment of Exposure Apparatus Based on Use of Third Liquid-Removing Unit FIG. 23 shows a modified embodiment of the exposure apparatus based on the use of the third liquid-removing unit shown in FIG. 19. With reference to FIG. 23, a gas nozzle 160, which has a blow port 161, is attached to a liquid-receiving member 190. The liquid-receiving member 190 is a dish-shaped member which is formed to be larger than the occupied area occupied by the optical element 2, the nozzles 173, 177, and the first and second optical members 151, 152. The liquid 1, which drips from the respective members, can be received by the upper surface of the liquid-receiving member 190. A liquid-absorbing member 199, which is formed of a porous member or a sponge-like member, is exchangeably provided on the upper surface of the liquid-receiving member 190. Accordingly, the liquid 1, which drips from the respective members, can be satisfactorily recovered (collected) and retained. A circumferential wall section 191 is formed for the liquid-receiving member 190. Therefore, it is possible to prevent the collected liquid 1 from any outflow from the liquid-receiving member 190.

The liquid-receiving member 190 is provided movably by the aid of a driving mechanism 193. The driving mechanism 193 includes an arm section 194, an actuator section 195, and a shaft section 196. One end of the arm section 194 is connected to the side surface of the liquid-receiving member 190, and the other end is connected to the actuator section 195. The actuator section 195 is attached so that the actuator section 195 is hung, for example, by a predetermined support section CL such as a column for supporting the projection optical system PL and the body of the exposure apparatus EX by the aid of the shaft section 196. When the actuator section 195 is driven, the liquid-receiving member 190, which is attached to one end of the arm section 194, makes swinging movement in the θZ direction about the swinging center of the shaft section 196. The control unit CONT can move the liquid-receiving member 190 back and forth with respect to the area under the projection optical system PL by driving the actuator section 195 of the driving mechanism 193 to cause the swinging movement of the liquid-receiving member 190. Further, the actuator section 195 is capable of moving the liquid-receiving member 190 in the Z axis direction by the aid of the arm section 194, and the actuator section 195 is capable of moving the liquid-receiving member 190 in the XY directions as well.

The liquid-receiving member 190 is provided with an image pickup unit 198 including, for example, CCD. The image pickup unit 198 is capable of outputting, as an image, the surface information about the optical element 2 and the first and second optical members 151, 152.

When the control unit CONT moves (removes) the liquid 1 adhered, for example, to the optical element 2 and the first and second optical members 151, 152, then the actuator section 195 is driven so that the optical element 2 is opposed to the liquid-receiving member 190, and the gas is blown against the optical element 2 while moving the gas nozzle 160 together with the liquid-receiving member 190 with respect to the optical element 2. The liquid 1, which adheres to the area of the optical element 2 corresponding to the optical path for the exposure light beam EL, is moved by the blown gas, and then the liquid 1 falls. The liquid 1, which has fallen from the optical element 2, is retained by the liquid-receiving member 190. Accordingly, for example, even when the substrate stage PST is arranged under the projection optical system PL and the liquid-receiving member 190, then the liquid 1 is received by the liquid-receiving member 190, and thus it is possible to avoid the inconvenience which would be otherwise caused such that the liquid 1, which is removed, for example, from the optical element 2, adheres to the substrate stage PST.

The control unit CONT controls the gas blow operation of the gas nozzle 160 on the basis of the image pickup result obtained by the image pickup unit 198. For example, the control unit CONT determines the position of the adhesion of the liquid 1 on the basis of the image pickup result obtained by the image pickup unit 198 to successfully perform the control such that the position of the adhesion of the liquid 1 and the gas nozzle 160 are subjected to the positional adjustment to allow the gas to blow thereagainst. Accordingly, it is possible to remove the liquid 1 more reliably. When it is judged that the liquid 1 is removed from the optical element 2, the control unit CONT completes the gas blow operation having been performed by the gas nozzle 160.

It is also appropriate to provide a positioning mechanism which positions, for example, the liquid-receiving member 190 and the first and second optical members 151, 152. A leaf spring member 192 as shown by broken lines in FIG. 23 can be used as the positioning mechanism. In the illustrative embodiment shown in FIG. 23, the leaf spring member 192 is provided on the upper surface 191A of the circumferential wall section 191 of the liquid-receiving member 190. When the liquid-receiving member 190 is moved in the +Z direction in accordance with the driving of the actuator section 195 to approach the first and second optical members 151, 152, the leaf spring member (positioning mechanism) 192 interposes the outer portions of the first and second optical members 151, 152. Accordingly, the first and second optical members 151, 152 and the liquid-receiving member 190 are positioned. In this state, the gas, which is discharged from the gas nozzle 160, is blown against a desired area of the optical element 2 (in this case, the area corresponding to the projection area AR1). Accordingly, it is possible to satisfactorily remove (move aside) the liquid 1 adhered to the area.

Figure 24:
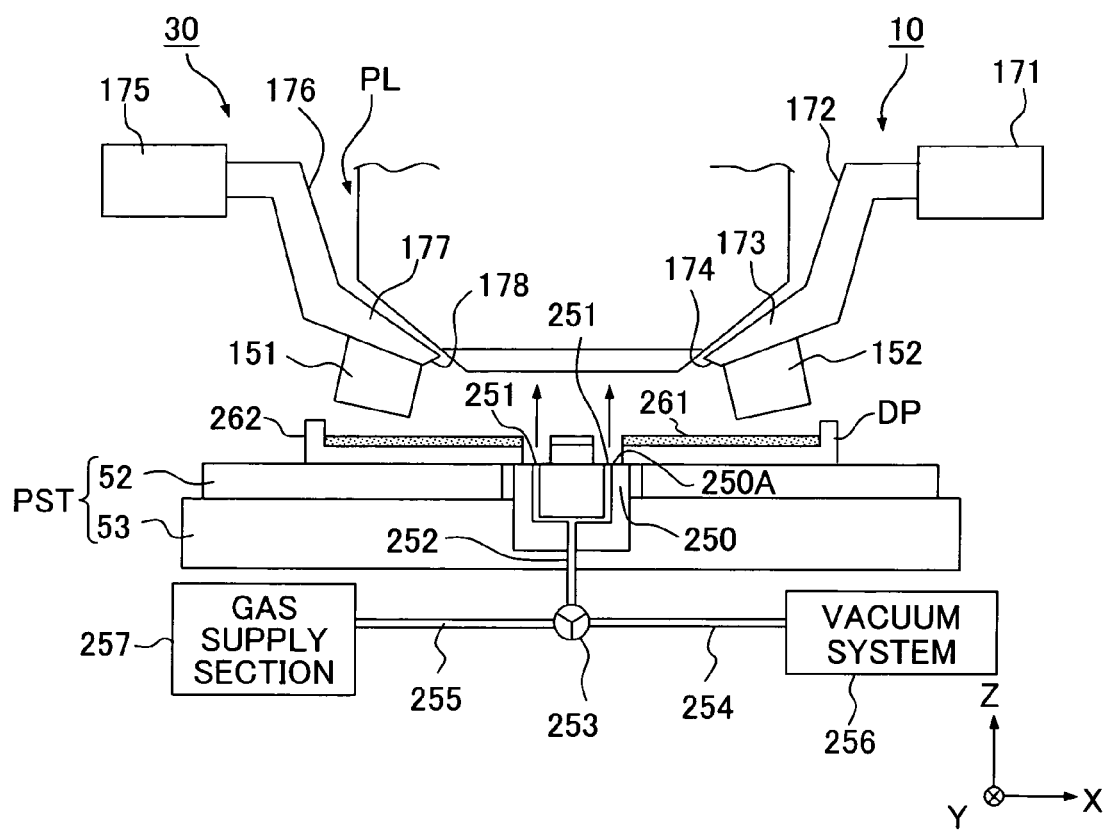
FIG. 24 schematically shows another embodiment of an exposure apparatus of the present invention.

Still Another Embodiment of Exposure Apparatus Based on Use of Third Liquid-Removing Unit FIG. 24 shows another modified embodiment of the exposure apparatus provided with the third liquid-removing unit. In this modified embodiment, the gas for removing the liquid is jetted or spouted not from the nozzle but from suction holes for sucking and attracting the substrate. With reference to FIG. 24, the substrate stage PST is provided with a center table 250 which is provided at a substantially central portion of the substrate stage PST as viewed in a plan view and which is movable in the Z axis direction. The center table 250 is movable in the Z axis direction by the aid of an unillustrated driving mechanism, which is provided to be capable of protruding from the upper surface of the substrate stage PST (Z stage 52). The suction holes 251 are provided on the upper surface 250A of the center table 250. The suction holes 251 are connected to one end of a flow passage 252 which is provided in the substrate stage PST. On the other hand, the other end of the flow passage 252 is capable of making communication with any one of one end of a first flow passage 254 and one end of a second flow passage 255 by the aid of a flow passage-switching unit 253. The other end of the first flow passage 254 is connected to a vacuum system 256, and the other end of the second flow passage 255 is connected to a gas supply section 257. When the flow passage-switching unit 253 connects the flow passage 252 and the first flow passage 254 to open the flow passage which connects the vacuum system 256 and the suction holes 251, the flow passage-switching unit 253 closes the flow passage which connects the gas supply section 257 and the suction holes 251. On the other hand, when the flow passage-switching unit 253 connects the flow passage 252 and the second flow passage 255 to open the flow passage which connects the gas supply section 257 and the suction holes 251, the flow passage-switching unit 253 closes the flow passage which connects the vacuum system 256 and the suction holes 251.

When the substrate P is loaded on the substrate stage PST, then the control unit CONT moves the center table 250 upwardly to place the substrate P on the center table 250, and the vacuum system 256 is driven to attract and hold the back surface of the substrate P by the aid of the suction holes 251. The control unit CONT moves the center table 250 downwardly in a state in which the substrate P is attracted and held, and the substrate P is held on the substrate holder on the Z stage 52. The substrate holder is provided, for example, with a pin-chuck mechanism. The substrate holder attracts and holds the substrate P by the pin-chuck mechanism. On the other hand, when the substrate P is unloaded from the substrate stage PST, then the control unit CONT releases the substrate P from being attracted and held by the substrate holder, and the center table 250 is moved upwardly while attracting and holding the substrate P. When the center table 250 is moved upwardly in a state in which the substrate P is attracted and held thereby, then the substrate P is separated from the Z stage, and the unload operation can be performed.

In this embodiment, the gas is blown from the suction holes 251 provided for the center table 250. The blown gas is used to move (move aside) the liquid 1 adhered to the lower surface 2a of the optical element 2 and the first and second optical members 151, 152. When the liquid 1 adhered to the optical element 2 and/or the first and second optical members 151, 152 is removed, the control unit CONT drives the flow passage-switching unit 253 to open the flow passage for connecting the gas supply section 257 and the suction holes 251. The control unit CONT moves the substrate stage PST along the XY plane, while the gas is blown from the suction holes 251. When the gas is blown, then the liquid 1, which has been adhered, for example, to the area of the lower surface 2a of the optical element 2 corresponding to the optical path for the exposure light beam EL, is moved, and then the liquid 1 falls.

In this embodiment, a liquid-receiving-member DP, which is capable of collecting the liquid 1, is installed on the Z stage 52 (substrate holder). The liquid-receiving member DP is a dish-shaped member in the same manner as the liquid-receiving member 190 shown in FIG. 23, which is formed to have a circular shape with a size substantially equivalent to that of the substrate P. The liquid-receiving member DP can be installed on the substrate holder. The liquid 1, which has fallen from the optical element 2, is retained by the liquid-receiving member DP installed for the substrate holder. A liquid-retaining member 261 is provided on the upper surface of the liquid-receiving member DP. The liquid 1 is recovered and retained by the liquid-retaining member 261. The liquid-receiving member DP has a circumferential wall section 262 which prevents the retained liquid 1 from any outflow from the liquid-receiving member DP.

Figure 25:
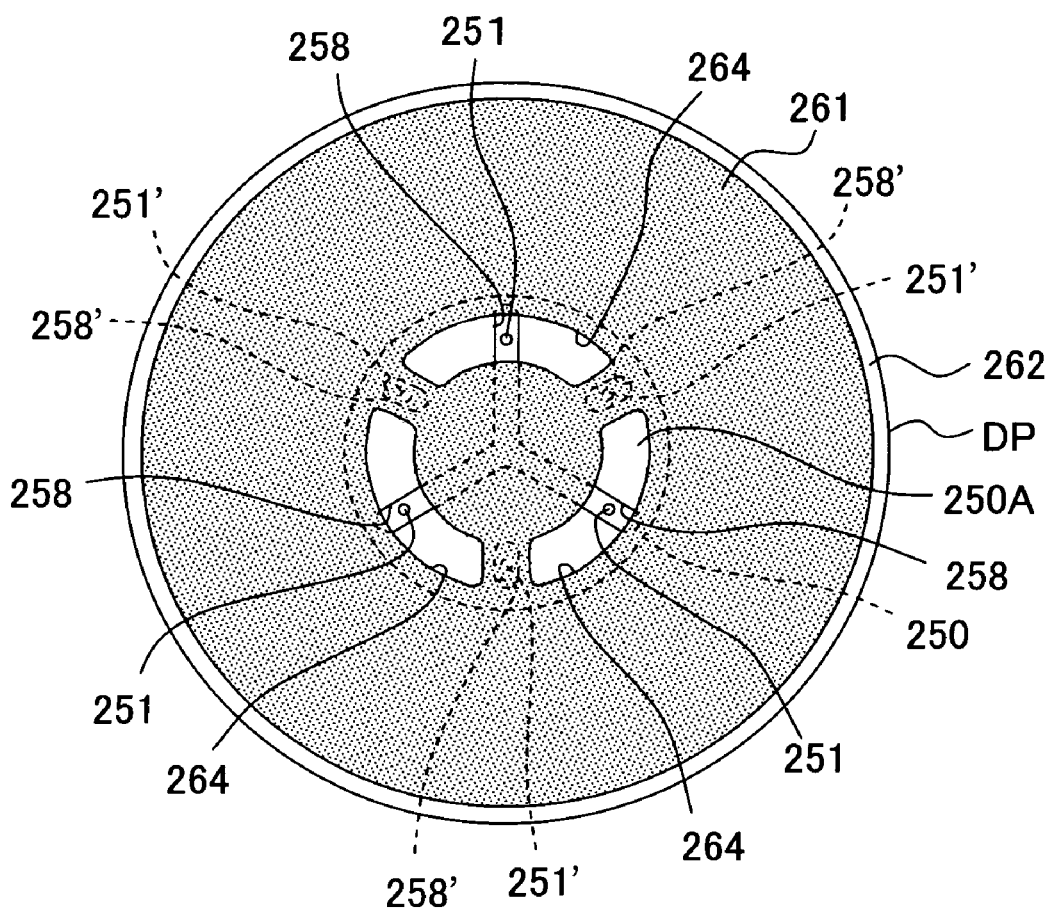
FIG. 25 shows a plan view illustrating major parts of a substrate stage shown in FIG. 24 as viewed from an upper position.
Figure 25:
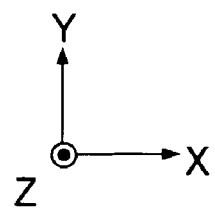

FIG. 25 shows the liquid-receiving member DP held by the substrate holder as viewed from an upper position. With reference to FIG. 25, a plurality of the suction holes 251 are provided on the upper surface 250A of the center table 250. In this embodiment, the three suction holes are provided. A plurality of (three) openings 264, which correspond to the plurality of suction holes 251, are provided for the liquid-receiving member DP. That is, the suction holes 251 are exposed even in a state in which the liquid-receiving member DP is held by the substrate holder. Therefore, the gas, which is discharged or spouted from the suction holes 251, is successfully blown against the optical element 2 or the like. A plurality of (three) grooves 258, which extend in the radial direction from the central portion of the upper surface 250A, are formed on the upper surface 250A of the center table 250. The plurality of grooves 258 are continued to one another at the central portion of the upper surface 250A. The suction holes 251 are arranged inside the grooves 258. When the back surface of the substrate P as the exposure process objective is attracted and held by the upper surface 250A of the center table 250, then the vacuum system 256 is driven in a state in which the back surface of the substrate P abuts against the upper surface 250A, and the space, which is formed by the back surface of the substrate P and the grooves 258, is allowed to have a negative pressure. Accordingly, the substrate P can be attracted and held by the center table 250. When the liquid-receiving member DP is held by the center table 250, the liquid-receiving member DP can be also held by the center table 250 by appropriately setting, for example, the shapes and the sizes of the opening 264 and the groove 258 and/or the size and the position of the suction hole 251. Alternatively, suction holes and grooves corresponding thereto, which are different from the suction holes 251 and which are exclusively used to attract and hold the liquid-receiving member DP, may be previously provided on the upper surface 250A of the center table 250 (see reference numerals 251' and 258' shown in FIG. 25). The suction holes 251' may be used to attract and hold the liquid-receiving member DP with respect to the upper surface 250A. The center table 250 can be used to load/unload the liquid-receiving member DP with respect to the substrate stage PST, in the same manner as the substrate P as the exposure process objective. When the liquid removal operation is performed for the optical element 2 or the like, the liquid-receiving member DP is loaded on the substrate stage PST. When the liquid removal operation is completed, the liquid-receiving member DP is unloaded from the substrate stage PST. When the liquid-receiving member DP is attracted and held by the pin-chuck mechanism of the substrate holder, the following arrangement is adopted in order to form a substantially tightly closed space with respect to the back surface of the liquid-receiving member DP other than the openings 264. That is, for example, the area, which is allowed to have a negative pressure by the pin-chuck mechanism, may be divided into a plurality of pieces. The negative pressure is selectively applied in the area other than the area corresponding to the openings 264. Accordingly, the liquid-receiving member DP can be attracted and held with respect to the substrate holder.

There is such a possibility that the liquid 1, which is retained by the liquid-receiving member DP, may invade the space between the back surface of the liquid-receiving member DP and the upper surface 250A of the center table 250 (as well as the upper surface of the substrate holder) via the openings 264. Therefore, it is preferable to provide a seal member, for example, in the vicinity of the openings 264 and/or the back surface of the liquid-receiving member DP in order to avoid the invasion of the liquid 1.

It is preferable that the substrate stage PST is moved to any position away from the projection optical system PL, for example, to the load/unload position B (see FIG. 9) to blow the gas beforehand from the suction holes 251 at the position before blowing the gas discharged from the suction holes 251 against the optical element 2 or the like. There is such a possibility that any foreign matter (dust) may be present in the suction holes 251 and/or in the vicinity of thereof. However, when the gas is blown against the optical lens 2 or the like after the gas blow operation is previously performed to remove the foreign matter at the position separated from the projection optical system PL, it is possible to avoid the inconvenience such as the pollution of the optical element 2 or the like.

Also in the embodiment shown in FIG. 24, the blow port 64A as explained, for example, with reference to FIG. 8 may be provided at any position other than the position of the substrate holder for holding the substrate P on the substrate stage PST, and the gas blown from the blow port 64A can be used to move the liquid 1 adhered to the optical element 2 or the like.

In the embodiments described above, the first to fourth liquid-removing units have been explained. However, each of the removing units as described above may be provided on the exposure apparatus EX singly. Alternatively, the removing units as described above may be appropriately combined and provided on the exposure apparatus EX.

As described above, pure water is used as the liquid 1 in the embodiments of the present invention. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL.

It is approved that the refractive index n of pure water (water) with respect to the exposure light beam EL having a wavelength of about 193 nm is approximately in an extent of 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In this embodiment, the optical element 2 is attached to the end portion of the projection optical system PL. The lens can be used to adjust the optical characteristics of the projection optical system PL, including, for example, the aberration (for example, spherical aberration and comatic aberration). The optical element 2, which is attached to the end portion of the projection optical system PL, may be an optical plate to adjust the optical characteristic of the projection optical system PL. Alternatively, the optical element 2 may be a plane parallel plate through which the exposure light beam EL is transmissive. When the optical element 2 to make contact with the liquid 1 is the plane parallel plate which is cheaper than the lens, it is enough that the plane parallel plate is merely exchanged immediately before supplying the liquid 1 even when any substance (for example, any silicon-based organic matter), which deteriorates the transmittance of the projection optical system PL, the illuminance of the exposure light beam EL on the substrate P, and the uniformity of the illuminance distribution, is adhered to the plane parallel plate, for example, during the transport, the assembling, and/or the adjustment of the exposure apparatus EX. An advantage is obtained such that the exchange cost is lowered as compared with the case in which the optical element to make contact with the liquid 1 is the lens. That is, the surface of the optical element to make contact with the liquid 1 is dirtied, for example, due to the adhesion of scattered particles generated from the resist by being irradiated with the exposure light beam EL or any adhered impurity contained in the liquid 1. Therefore, it is necessary to periodically exchange the optical element. However, when the optical element is the cheap plane parallel plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid 1, is large between the substrate P and the optical element disposed at the end portion of the projection optical system PL, it is also allowable that the optical element is tightly fixed so that the optical element is not moved by the pressure, rather than allowing the optical element to be exchangeable.

The embodiment of the present invention is constructed such that the space between the projection optical system PL and the surface of the substrate P is filled with the liquid 1. However, for example, another arrangement may be adopted such that the space is filled with the liquid 1 in a state in which a cover glass constructed of a plane parallel plate is attached to the surface of the substrate P.

The liquid 1 is water in the embodiment of the present invention. However, the liquid 1 may be any liquid other than water. For example, when the light source of the exposure light beam EL is the $F_2$ laser, the $F_2$ laser beam is not transmitted through water. Therefore, in this case, those preferably usable as the liquid 1 may include, for example, a fluorine-based fluid such as fluorine-based oil and perfluoropolyether (PFPE) through which the $F_2$ laser beam is transmissive. In this case, the portion to make contact with the liquid 1 is subjected to the liquid-attracting treatment by forming a thin film, for example, with a substance having a molecular structure of small polarity including fluorine. Alternatively, other than the above, it is also possible to use, as the liquid 1, liquids (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid 1 to be used.

When the liquid immersion method is used as described above, the numerical aperture NA of the projection optical system is 0.9 to 1.3 in some cases. When the numerical aperture NA of the projection optical system is increased as described above, the image formation performance is sometimes deteriorated by the polarization effect with the random polarized light beam having been hitherto used as the exposure light beam. Therefore, it is desirable to use the polarized illumination. In this case, the following procedure is preferred. That is, the linear polarized illumination is effected, which is adjusted to the longitudinal direction of the line pattern of the line-and-space pattern of the mask (reticle) so that a large amount of diffracted light of the S-polarized component (TE-polarized component), i.e., the component in the polarization direction along the longitudinal direction of the line pattern is allowed to outgo from the pattern of the mask (reticle). When the space between the projection optical system PL and the resist coated on the surface of the substrate P is filled with the liquid, the diffracted light of the S-polarized component (TE-polarized component), which contributes to the improvement in the contrast, has the transmittance through the resist surface that is raised to be high as compared with a case in which the space between the projection optical system PL and the resist coated on the surface of the substrate P is filled with the air (gas). Therefore, even when the numerical aperture NA of the projection optical system exceeds 1.0, it is possible to obtain the high image formation performance. It is more effective to make appropriate combination, for example, with the phase shift mask and/or the oblique incidence illumination method (especially the dipole illumination method) adjusted to the longitudinal direction of the line pattern as disclosed in Japanese Patent Application Laid-open No. 6-188169. For example, when a phase shift mask of the half tone type having a transmittance of 6% (pattern having a half pitch of about 45 nm) is illuminated by using the linear polarized illumination method and the dipole illumination method in combination, the depth of focus (DOF) can be increased by about 150 nm as compared with a case in which any random polarized light beam is used, assuming that the illumination σ, which is prescribed by circumscribed circles of two light fluxes for forming the dipole on the pupil plane of the illumination system, is 0.95, the radii of the respective light fluxes on the pupil plane are 0.125σ, and the numerical aperture of the projection optical system PL is NA=1.2.

Further, for example, when the ArF excimer laser beam is used as the exposure light beam, and the substrate P is exposed with a fine line-and-space pattern (for example, line-and-space of about 25 to 50 nm) by using the projection optical system PL having a reduction magnification of about ¼, then the mask M functions as a polarizing plate on account of the Wave Guide effect depending on the structure of the mask M (for example, the pattern fineness and the chromium thickness), and a large amount of the diffracted light beam of the S-polarized component (TE-polarized component) is radiated from the mask M as compared with the diffracted light beam of the P-polarized component (TM-component) which lowers the contrast. In such a situation, it is desirable that the linear polarized illumination is used as described above. However, the high resolution performance can be obtained even when the numerical aperture NA of the projection optical system PL is large, for example, 0.9 to 1.3 even when the mask M is illuminated with the random polarized light beam.

When the substrate P is exposed with an extremely fine line-and-space pattern on the mask M, there is also such a possibility that the P-polarized component (TM-polarized component) may be larger than the S-polarized component (TE-polarized component) on account of the Wire Grid effect. However, when the ArF excimer laser beam is used as the exposure light beam, and the substrate P is exposed with a line-and-space pattern larger than 25 nm by using the projection optical system PL having a reduction magnification of about ¼, then a large amount of the diffracted light beam of the S-polarized component (TE-polarized component) is radiated from the mask M as compared with the P-polarized component (TM-polarized component). Therefore, the high resolution performance can be obtained even when the numerical aperture NA of the projection optical system PL is large, for example, 0.9 to 1.3.

Further, it is also effective to use a combination of the oblique incidence illumination method and the polarized illumination method in which the linear polarization is effected in a tangential (circumferential) direction of a circle having a center of the optical axis as disclosed in Japanese Patent Application Laid-open No. 6-53120 as well as the linear polarized illumination (S-polarized illumination) adjusted to the longitudinal direction of the line pattern of the mask (reticle). In particular, when the pattern of the mask (reticle) includes not only the line pattern which extends in a predetermined one direction but the pattern also includes line patterns which extend in a plurality of directions in a mixed manner, then the high image formation performance can be obtained even when the numerical aperture NA of the projection optical system is large, by using, in combination, the zonal illumination method and the polarized illumination method in which the linear polarization is effected in a tangential direction of a circle having a center of the optical axis as disclosed in Japanese Patent Application Laid-open No. 6-53120 as well. For example, when a phase shift mask of the half tone type (pattern having a half pitch of about 63 nm) having a transmittance of 6% is illuminated by using, in combination, the zonal illumination method (zonal ratio: ¾) and the polarized illumination method in which the linear polarization is effected in a tangential direction of a circle having a center of the optical axis, the depth of focus (DOF) can be increased by about 250 nm as compared with a case in which any random polarized light beam is used, assuming that the illumination σ is 0.95, and the numerical aperture of the projection optical system PL is NA=1.00. When the numerical aperture of the projection optical system is NA=1.2 with a pattern having a half pitch of about 55 nm, it is possible to increase the depth of focus by about 100 nm.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

The present invention is also applicable to a twin-stage type exposure apparatus. The structure and the exposure operation of the twin-stage-type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

The embodiments described above adopt the exposure apparatus in which the space between the projection optical system PL and the substrate P is locally filled with the liquid. However, the present invention is also applicable to a liquid immersion exposure apparatus wherein a stage, which holds the substrate as the exposure objective, is moved in a liquid bath. For example, Japanese Patent Application Laid-open No. 6-124873 discloses the structure and the exposure operation of the liquid immersion exposure apparatus wherein the stage, which holds the substrate as the exposure objective, is moved in the liquid bath. For example, U.S. Pat. No. 5,825,043 (Japanese Patent Application Laid-open No. 10-303114)

discloses an exposure apparatus wherein a liquid bath is formed on a substrate stage to hold the substrate therein. The contents of the description in U.S. Pat. No. 5,825,043 are incorporated herein by reference within a range of permission of the domestic laws and ordinances of the state designated or selected in this international application.

As for the type of the exposure apparatus EX, the present invention is not limited to the exposure apparatus for the semiconductor device production apparatus for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 26:
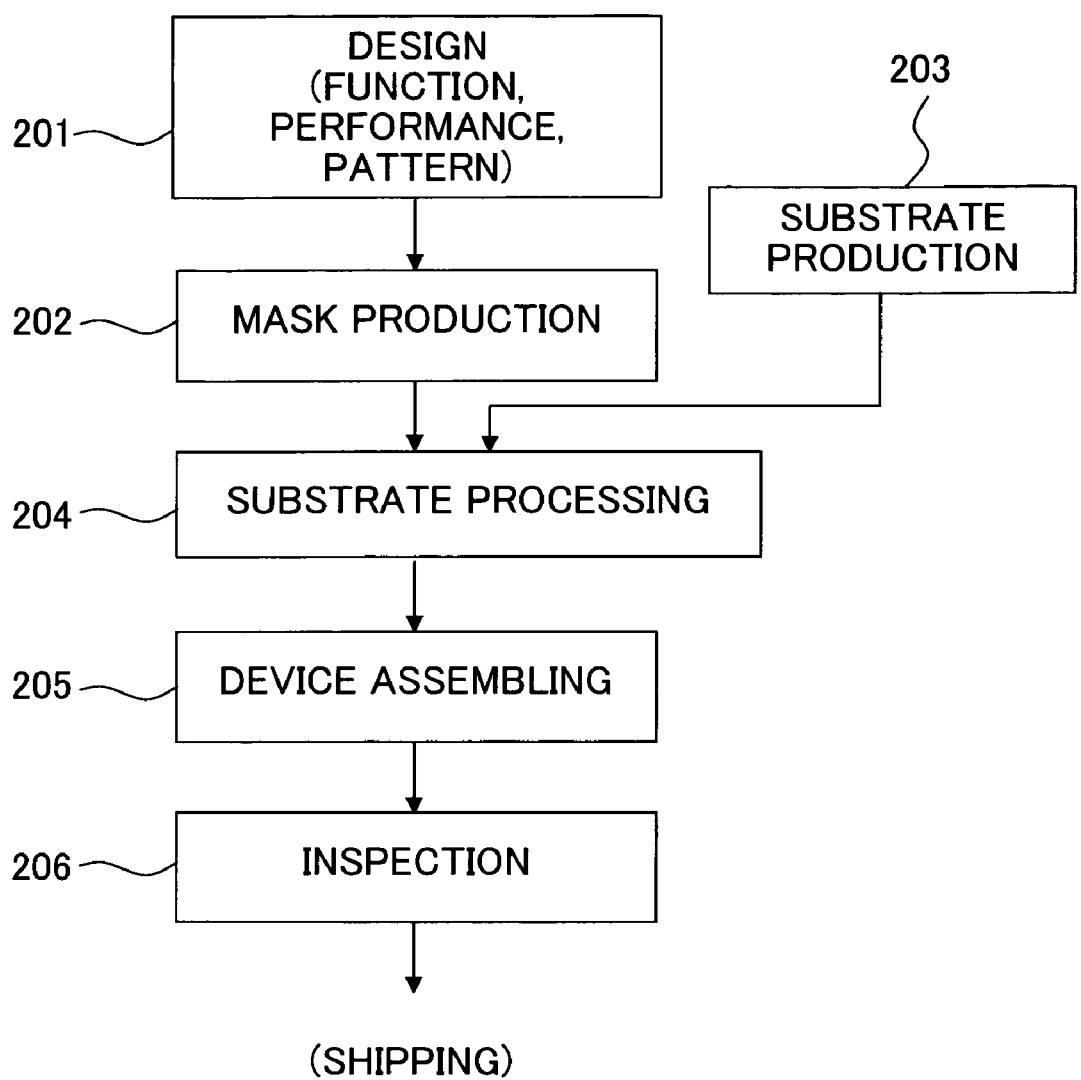
FIG. 26 shows a flow chart illustrating exemplary steps of producing a semiconductor device.

As shown in FIG. 26, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

According to the present invention, it is possible to avoid the occurrence of the rust or the like on the apparatus and the environmental change in the exposure apparatus caused by the falling of the remaining liquid, by removing the unnecessary liquid remaining on the part arranged in the vicinity of the image plane of the projection optical system. In particular, it is possible to avoid the occurrence of the adhesion trace (water mark) on the optical element, by removing the liquid remaining on the optical element disposed at the end portion of the projection optical system. Therefore, it is possible to accurately form a desired pattern on the substrate.

What is claimed is:

1. An exposure apparatus which projects an image of a pattern onto a substrate through a liquid to expose the substrate therewith, the exposure apparatus comprising:
   a projection optical system which projects the image of the pattern onto the substrate;
   a movable member which is movable on a side of an image plane of the projection optical system;
   a measuring member provided on the movable member; and
   a liquid-removing system which removes liquid remaining on the measuring member.

2. The exposure apparatus according to claim 1, wherein the liquid-removing system sucks the remaining liquid.

3. The exposure apparatus according to claim 1, wherein the liquid-removing system blows a gas against the measuring member.

4. The exposure apparatus according to claim 3, wherein the liquid-removing system removes the liquid by using a clean gas or a dry gas.

5. The exposure apparatus according to claim 3, wherein the gas includes nitrogen gas.

6. The exposure apparatus according to claim 1, further comprising a second liquid-removing system which removes liquid remaining on a part, wherein the part includes a last optical element of the projection optical system.

7. The exposure apparatus according to claim 6, wherein the part makes contact with the liquid during the exposure for the substrate.

8. The exposure apparatus according to claim 6, further comprising a washing system which washes the part.

9. The exposure apparatus according to claim 6, further comprising a detection system which detects a state of a surface of the part.

10. The exposure apparatus according to claim 6, wherein the second liquid-removing system includes a gas blow port which is provided for the movable member and which supplies a gas upwardly from the movable member.

11. The exposure apparatus according to claim 6, further comprising an optical member which makes contact with the liquid in a liquid immersion area, and a focus-detecting system, wherein a light beam, which is radiated from the focus-detecting system, is transmitted through the optical member and the liquid, and the light beam arrives at the substrate; and the part includes the optical member.

12. The exposure apparatus according to claim 6, wherein the second liquid-removing system includes a gas-supply port which is movable relative to the part.

13. The exposure apparatus according to claim 12, further comprising a liquid-receiving member which receives the liquid which has been removed by the second liquid-removing system, and an actuator which moves the liquid-receiving member relative to the projection optical system.

14. The exposure apparatus according to claim 12, wherein a positive or negative pressure is selectively supplied to the supply port.

15. The exposure apparatus according to claim 1, further comprising a second liquid-removing system which removes liquid remaining on a part, wherein the part has a liquid supply port.

16. The exposure apparatus according to claim 1, further comprising a second liquid-removing system which removes liquid remaining on a part, wherein the part has a liquid recovery port.

17. The exposure apparatus according to claim 1, wherein the movable member retains the substrate.

18. The exposure apparatus according to claim 1, wherein the liquid-removing system removes liquid remaining on a portion of the movable member which is different from the measuring member.

19. The exposure apparatus according to claim 1, wherein the measuring member has a reference member.

20. The exposure apparatus according to claim 19, wherein the reference member has a mark used for adjusting positional relation between the image and the substrate.

21. The exposure apparatus according to claim 1, further comprising a measuring system including an upper plate which has a light-transmitting portion which transmits an exposure light beam from the projection optical system therethrough, and a light-receiving system which receives the light beam having passed through the light-transmitting portion of the upper plate, wherein the measuring member includes the upper plate of the measuring system.

22. The exposure apparatus according to claim 1, wherein at least a part of the liquid-removing system is provided on the movable member.

23. The exposure apparatus according to claim 22, wherein the liquid-removing system includes a liquid-collecting portion which collects the liquid having been removed from the measuring member.

24. The exposure apparatus according to claim 1, wherein a surface of the measuring member is liquid-repellent.

25. The exposure apparatus according to claim 1, wherein the liquid-removing system moves the liquid remaining in a predetermined area on a surface of the measuring member to outside of the predetermined area.

26. The exposure apparatus according to claim 1, wherein the liquid-removing system removes the liquid remaining on the measuring member before the exposure.

27. The exposure apparatus according to claim 26, further comprising a liquid recovery system which recovers the liquid from a surface of the substrate during the exposure, the liquid recovery system recovering the liquid from above the substrate.

28. The exposure apparatus according to claim 1, further comprising a control unit which controls the liquid-removing system, wherein the control unit controls the liquid-removing system to execute liquid removal operation by the liquid-removing system when the substrate is unloaded.

29. The exposure apparatus according to claim 1, further comprising a supply port which selectively supplies the liquid and a gas.

30. The exposure apparatus according to claim 29, further comprising a flow passage-switching device which switches flow passages for the liquid to be supplied to the supply port and the gas to be supplied to the supply port from the liquid-removing system.

31. A method for producing a device, comprising:
performing a measuring operation by using the measuring member of the exposure apparatus as defined in claim 1;
exposing a substrate, based on a result of the measuring operation, using the exposure apparatus as defined in claim 1; and
processing the exposed substrate.

32. The exposure apparatus according to claim 1, wherein the liquid-removing system includes a liquid-collecting portion which collects the liquid removed from the measuring member.

33. The exposure apparatus according to claim 32, wherein the liquid-collecting portion is connected to a vacuum apparatus.

34. The exposure apparatus according to claim 32, wherein the liquid-collecting portion includes a liquid-absorbing member.

35. The exposure apparatus according to claim 1, further comprising a liquid recovery system which recovers the liquid from a surface of the substrate during the exposure, the liquid recovery system recovering the liquid from above the substrate.

36. The exposure apparatus according to claim 35, wherein the liquid recovery system recovers the liquid from the surface of the substrate such that a liquid immersion area is formed on a portion of the surface of the substrate.

37. The exposure apparatus according to claim 1, wherein the measuring member is used in a state that an immersion area of liquid is formed on the measuring member.

38. The exposure apparatus according to claim 37, further comprising a sensor which detects a detection beam through the liquid filled in a gap between the projection optical system and the measuring member.

39. A liquid immersion exposure method comprising:
moving a movable member on which a measuring member is provided;
performing a measunng operation by using the measuring member;
exposing a substrate, based on a result of the measuring operation, by projecting a pattern image onto the substrate via a projection optical system and liquid; and performing a removal operation in which liquid remaining on the measuring member is removed.

40. The method according to claim 39, wherein the remaining liquid is sucked from on the measuring member.

41. The method according to claim 39, wherein the remaining liquid is removed by blowing a gas against the measuring member.

42. The method according to claim 39, further comprising retaining the substrate on the movable member.

43. The method according to claim 39, wherein the measuring member includes a reference member used for adjusting positional relation between the pattern image and the substrate.

44. The method according to claim 39, wherein the measuring operation is performed in a state that an immersion area of liquid is formed on the measuring member.

45. The method according to claim 44, wherein the measuring operation includes receiving a detection beam through a light-transmitting portion of the measuring member and the liquid filled in a gap between the projection optical system and the measuring member.

46. The method according to claim 44, wherein the removal operation is performed after the measuring operation.

47. The method according to claim 44, wherein the removal operation is performed after taking the liquid immersion area away from on the measuring member.

48. The method according to claim 47, wherein taking the liquid immersion area away from on the measuring member includes recovering the liquid which forms the immersion area from on the measuring member.

49. The method according to claim 39, further comprising collecting the liquid having been removed from the measuring member.

50. A device manufacturing method comprising:

exposing a substrate by using the exposure method defined in claim 39; and processing the exposed substrate.

* * * * *